US012787260B2

(12) United States Patent
Lee et al.

(10) Patent No.: US 12,787,260 B2
(45) Date of Patent: Nov. 3, 2026

(54) SEMICONDUCTOR DEVICES

(71) Applicant: Samsung Electronics Co., Ltd., Suwon-si (KR)

(72) Inventors: Minyoung Lee, Suwon-si (KR); Sungjin Yeo, Suwon-si (KR); Wonseok Yoo, Suwon-si (KR); Jaemin Woo, Suwon-si (KR); Kyeongock Chong, Suwon-si (KR); Myunghun Jung, Suwon-si (KR); Yoongi Hong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 556 days.

(21) Appl. No.: 18/332,413

(22) Filed: Jun. 9, 2023

(65) Prior Publication Data

US 2024/0040772 A1 Feb. 1, 2024

(30) Foreign Application Priority Data

Jul. 27, 2022 (KR) ........................ 10-2022-0093433

(51) Int. Cl.
*H10B 12/00* (2023.01)

(52) U.S. Cl.
CPC ....... *H10B 12/482* (2023.02); *H10B 12/0335* (2023.02); *H10B 12/315* (2023.02)

(58) Field of Classification Search
CPC . H10B 12/482; H10B 12/0335; H10B 12/315
See application file for complete search history.

(56) References Cited

U.S. PATENT DOCUMENTS

| | | | |
|---|---|---|---|
| 9,214,382 | B2 | 12/2015 | Lee et al. |
| 9,318,379 | B2 | 4/2016 | Lee et al. |
| 9,496,223 | B2 | 11/2016 | Lee et al. |
| 10,600,637 | B2 | 3/2020 | Suzuki et al. |

(Continued)

FOREIGN PATENT DOCUMENTS

| | | | |
|---|---|---|---|
| KR | 101164996 | B1 | 7/2012 |
| KR | 102059863 | B1 | 12/2019 |

(Continued)

OTHER PUBLICATIONS

Taiwanese Office Action dated Jun. 20, 2024 for corresponding Taiwanese Patent Application No. 112122518.

(Continued)

*Primary Examiner* — Samuel A Gebremariam
(74) *Attorney, Agent, or Firm* — Harness, Dickey & Pierce, P.L.C.

(57) ABSTRACT

A semiconductor device may include a bit line structure, a first spacer, and a second spacer on a substrate. The bit line structure may include a conductive structure and an insulation structure stacked in a vertical direction substantially perpendicular to an upper surface of the substrate. The first spacer and the second spacer may be stacked in a horizontal direction on a sidewall of the bit line structure. The horizontal direction may be substantially parallel to the upper surface of the substrate. The conductive structure may include a nitrogen-containing conductive portion at a lateral portion thereof. The first spacer may contact the nitrogen-containing conductive portion.

20 Claims, 25 Drawing Sheets

(56) References Cited

U.S. PATENT DOCUMENTS

| | | | | |
|---|---|---|---|---|
| 10,707,215 | B2 | 7/2020 | Simsek-Ege et al. | |
| 11,296,088 | B2 | 4/2022 | Hwang et al. | |
| 2019/0096890 | A1 | 3/2019 | Lee et al. | |
| 2019/0206873 | A1 * | 7/2019 | Kim | H10B 12/485 |
| 2020/0273697 | A1 | 8/2020 | Suzuki et al. | |
| 2021/0066304 | A1 * | 3/2021 | Kang | H10B 12/05 |
| 2021/0408004 | A1 | 12/2021 | Lee et al. | |
| 2022/0085026 | A1 | 3/2022 | Kim et al. | |
| 2022/0165657 | A1 | 5/2022 | Park et al. | |

FOREIGN PATENT DOCUMENTS

| | | | |
|---|---|---|---|
| KR | 2022/0036109 | A | 3/2022 |
| KR | 102378021 | B1 | 3/2022 |
| KR | 10-2022-0062959 | A | 5/2022 |
| KR | 10-2022-0082507 | A | 6/2022 |

OTHER PUBLICATIONS

Korean Notice of Allowance dated Sep. 18, 2026 for corresponding Korean Application No. 10-2022-0093433.

* cited by examiner

SEMICONDUCTOR DEVICES

CROSS-REFERENCE TO RELATED APPLICATION

This application claims priority under 35 U.S.C. § 119 to Korean Patent Application No. 10-2022-0093433 filed on Jul. 27, 2022 in the Korean Intellectual Property Office, the disclosure of which is hereby incorporated by reference in its entirety.

TECHNICAL FIELD

Example embodiments of the present disclosure relate to a semiconductor device. More particularly, example embodiments of the present disclosure relate to a DRAM device.

DISCUSSION OF RELATED ART

As the integration degree of the DRAM device increases, distances between the bit line structures in the DRAM device decreases. Thus, a space for forming a contact plug structure between the bit line structures may not be sufficient, and parasitic capacitance between the bit line structures may increase.

SUMMARY

Example embodiments provide a semiconductor device having improved characteristics.

According to example embodiments of inventive concepts, a semiconductor device may include a bit line structure, a first spacer, and a second spacer on a substrate. The bit line structure may include a conductive structure and an insulation structure stacked in a vertical direction substantially perpendicular to an upper surface of the substrate. The first spacer and the second spacer may be stacked in a horizontal direction on a sidewall of the bit line structure. The horizontal direction may be substantially parallel to the upper surface of the substrate. The conductive structure may include a nitrogen-containing conductive portion at a lateral portion thereof. The first spacer may contact the nitrogen-containing conductive portion.

According to example embodiments of inventive concepts, a semiconductor device may include a bit line structure, a first spacer, and a second spacer on a substrate. The bit line structure may have a first conductive pattern including a metal. The first spacer may contact a sidewall of the bit line structure, and the first spacer may include an oxide. The second spacer may contact an outer sidewall of the first spacer, and the second spacer may include a nitride. The first conductive pattern may include a first nitrogen-containing portion at a lateral portion contacting the first spacer, and the first nitrogen-containing portion may include nitrogen.

According to example embodiments of inventive concepts, a semiconductor device may include an active pattern, an isolation pattern, a gate structure, a bit line structure, a first spacer, a second spacer, a contact plug structure, and a capacitor on a substrate. The isolation pattern may cover a sidewall of the active pattern. The gate structure may extend in a first direction. The first direction may be substantially parallel to an upper surface of the substrate. The gate structure may be buried in an upper portion of the active pattern and an upper portion of the isolation pattern. The bit line structure may be on a central portion of the active pattern and the isolation pattern, and the bit line structure may extend in a second direction. The second direction may be substantially parallel to the upper surface of the substrate and substantially perpendicular to the first direction. The bit line structure may include a conductive structure and an insulation structure stacked in a vertical direction. The vertical direction may be substantially perpendicular to the upper surface of the substrate. The first spacer and the second spacer may be stacked in the first direction on a sidewall of the bit line structure. The contact plug structure may be on each of opposite end portions of the active pattern. The capacitor may be on the contact plug structure. The conductive structure may have a nitrogen-containing conductive portion at a lateral portion thereof, and the nitrogen-containing conductive portion may include nitrogen. The first spacer may contact the nitrogen-containing conductive portion.

DETAILED DESCRIPTION

The above and other aspects and features of a semiconductor device and a method of forming the same in accordance with example embodiments will become readily understood from detail descriptions that follow, with reference to the accompanying drawings. It will be understood that, although the terms "first," "second," and/or "third" may be used herein to describe various materials, layers (films), regions, electrodes, pads, patterns, structures and processes, these materials, layers (films), regions, electrodes, pads, patterns, structures and processes should not be limited by these terms. These terms are only used to distinguish one material, layer (film), region, electrode, pad, pattern, structure and process from another material, layer (film), region, electrode, pad, pattern, structure and process. Thus, a first material, layer (film), region, electrode, pad, pattern, structure and process discussed below could be termed a second or third material, layer (film), region, electrode, pad, pattern, structure and process without departing from the teachings of inventive concepts.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, in the specification (and not necessarily in the claims), two directions that are substantially perpendicular to each other among horizontal directions, which are substantially parallel to an upper surface of a substrate, may be referred to as first and second directions D1 and D2, respectively, and a direction having an acute angle with respect to the first and second directions D1 and D2 among the horizontal directions may be referred to as a third direction D3.

Figure 1:
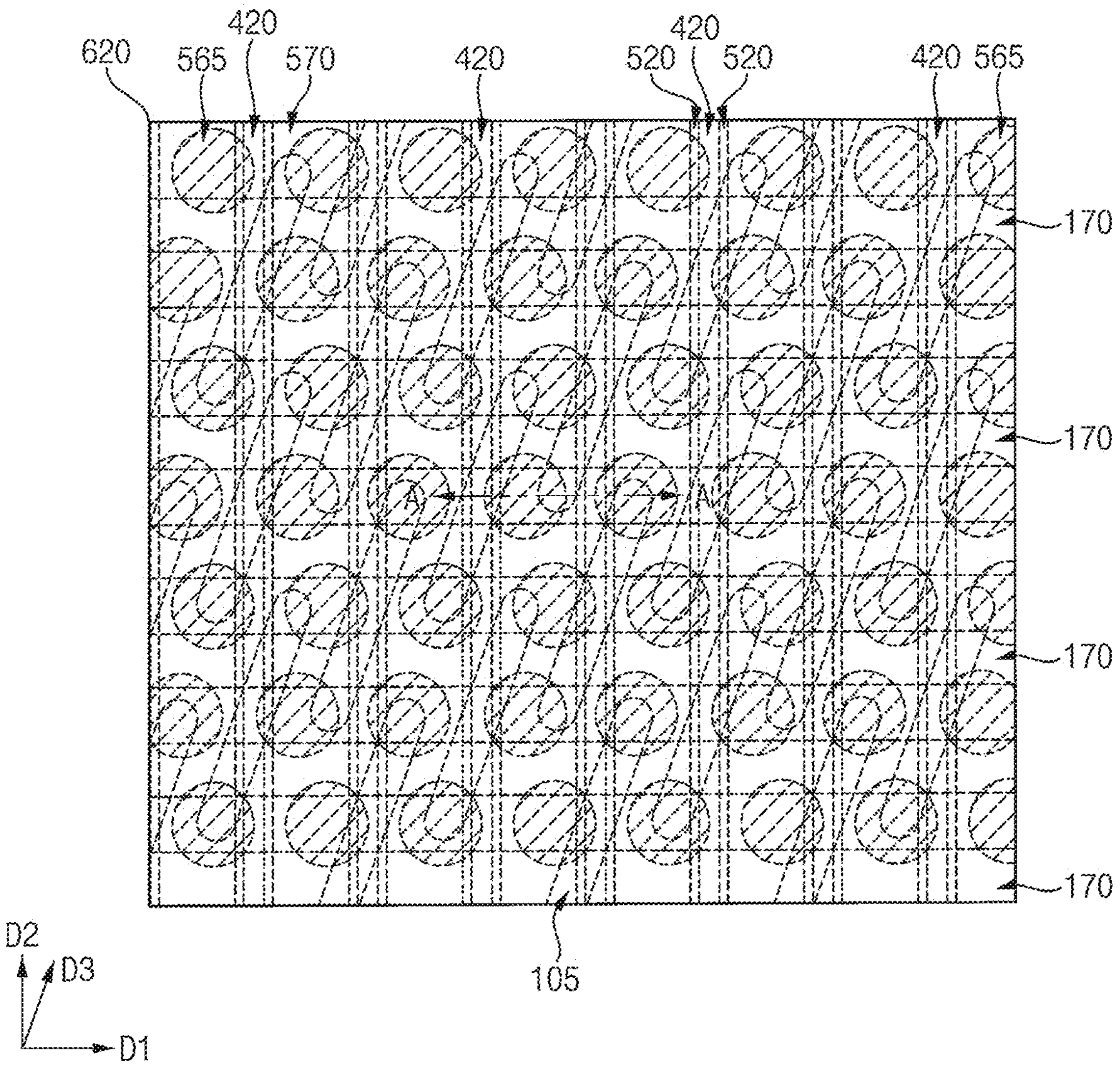
FIG. 1 is a plan view illustrating a semiconductor device in accordance with example embodiments.
Figure 2A:
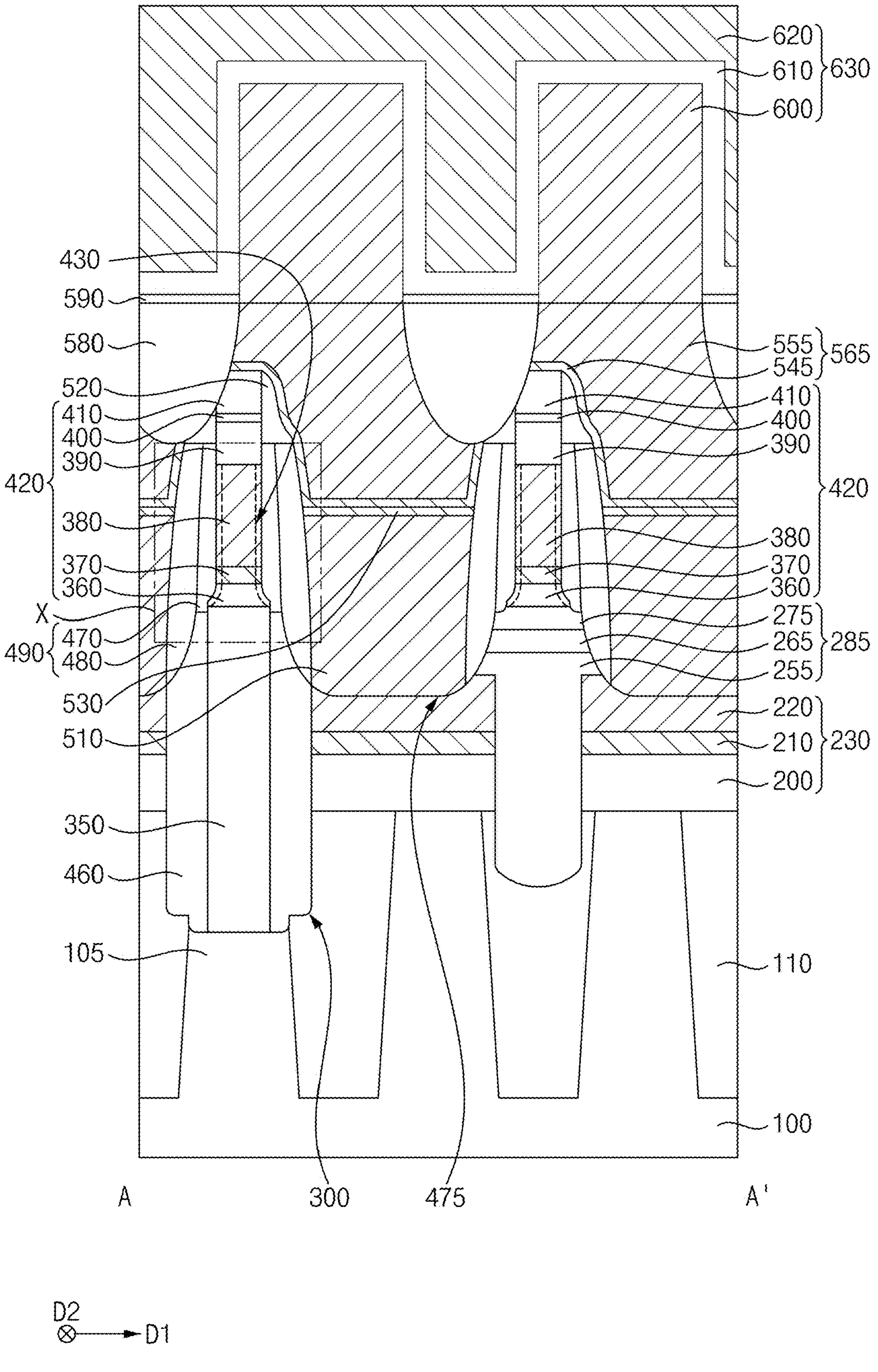
FIG. 2A is a cross-sectional view taken along line A-A' of FIG. 1.
Figure 2B:
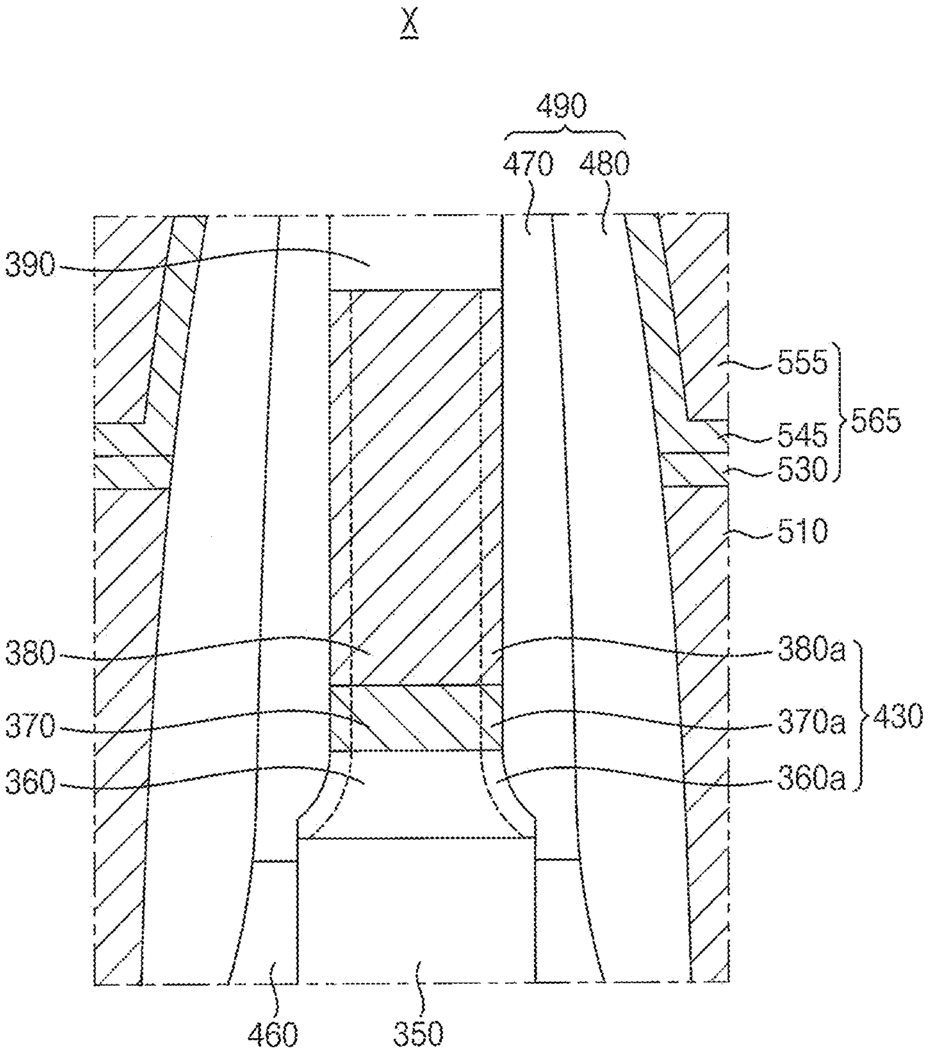
FIG. 2B is an enlarged cross-sectional view of region X in FIG. 2A.

FIG. 1 is a plan view illustrating a semiconductor device in accordance with example embodiments, FIG. 2A is a cross-sectional view taken along line A-A' of FIG. 1, and FIG. 2B is an enlarged cross-sectional view of region X in FIG. 2A.

Referring to FIGS. 1, 2A and 2B, the semiconductor device may include an active pattern 105, an isolation pattern 110, a gate structure 170, a filling structure, a bit line structure 420, a spacer structure 490, a third spacer 520, a contact plug structure and a capacitor 630.

The semiconductor device may further include a conductive pad structure 230, an insulating pad structure 285, an insulation pattern 580, a third etch stop layer 590, and a second capping pattern 505.

The substrate 100 may include silicon, germanium, silicon-germanium, or a III-Vgroup compound semiconductor, such as GaP, GaAs, or GaSb. In example embodiments, the substrate 100 may be a silicon-on-insulator (SOI) substrate or a germanium-on-insulator (GOI) substrate.

In example embodiments, the active pattern 105 may extend in the third direction D3, and a plurality of active patterns 105 may be spaced apart from each other in the first and second directions D1 and D2. The active pattern 105 may include a material substantially the same as a material of the substrate 100.

The isolation pattern 110 may be formed on the substrate 100, and may cover a sidewall of the active pattern 105. The isolation pattern 110 may include an oxide, e.g., silicon oxide.

Figure 4:
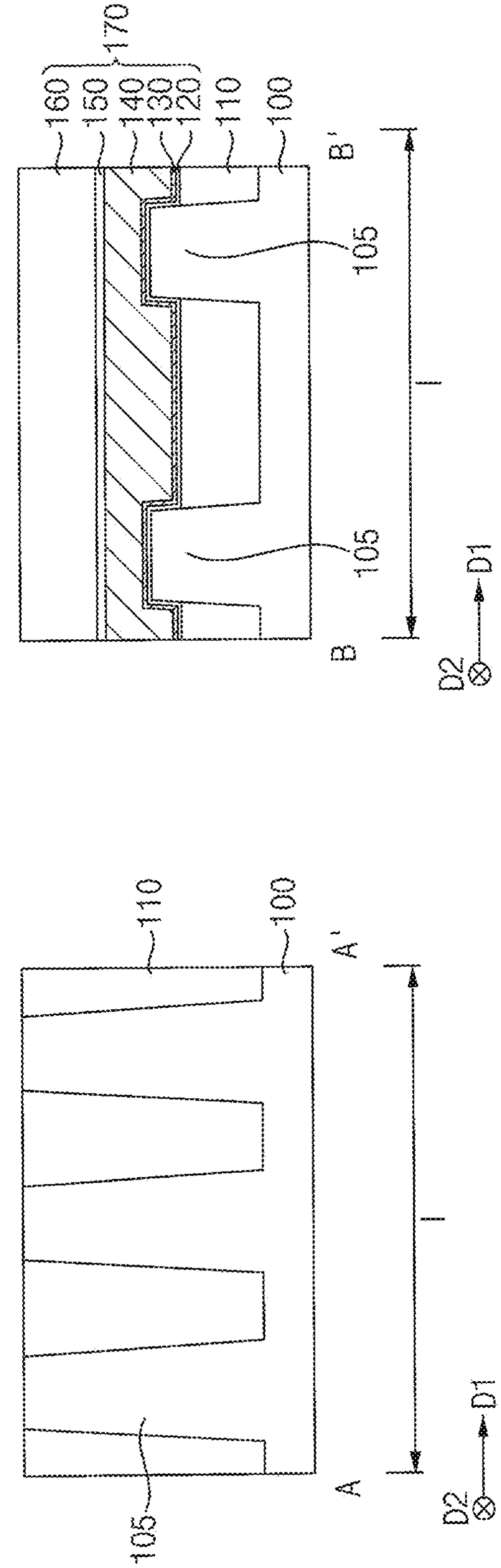

Referring to FIG. 4, the gate structure 170 may be formed in a second recess extending in the first direction D1 through upper portions of the active pattern 105 and the isolation pattern 110. The gate structure 170 may include a gate insulation pattern 120 on a bottom and a sidewall of the second recess, a first barrier pattern 130 on a portion of the gate insulation pattern 120 on the bottom and a lower sidewall of the second recess, a first conductive pattern 140 on the first barrier pattern 130 and filling a lower portion of the second recess, a second conductive pattern 150 on upper surfaces of the first barrier pattern 130 and the first conductive pattern 140, and a gate mask 160 on an upper surface of the second conductive pattern 150 and an upper inner sidewall of the gate insulation pattern 120 and filling an upper portion of the second recess. The first barrier pattern 130, the first conductive pattern 140 and the second conductive pattern 150 may collectively form a gate electrode.

The gate insulation pattern 120 may include an oxide, e.g., silicon oxide, the first barrier pattern 130 may include a metal nitride, e.g., titanium nitride, tantalum nitride, etc., the first conductive pattern 140 may include, e.g., a metal, a metal nitride, a metal silicide, doped polysilicon, etc., the second conductive pattern 150 may include, e.g., doped polysilicon, and the gate mask 160 may include a nitride, e.g., silicon nitride.

In example embodiments, the gate structure 170 may extend in the first direction D1, and a plurality of gate structures 170 may be spaced apart from each other in the second direction D2.

Figure 5:
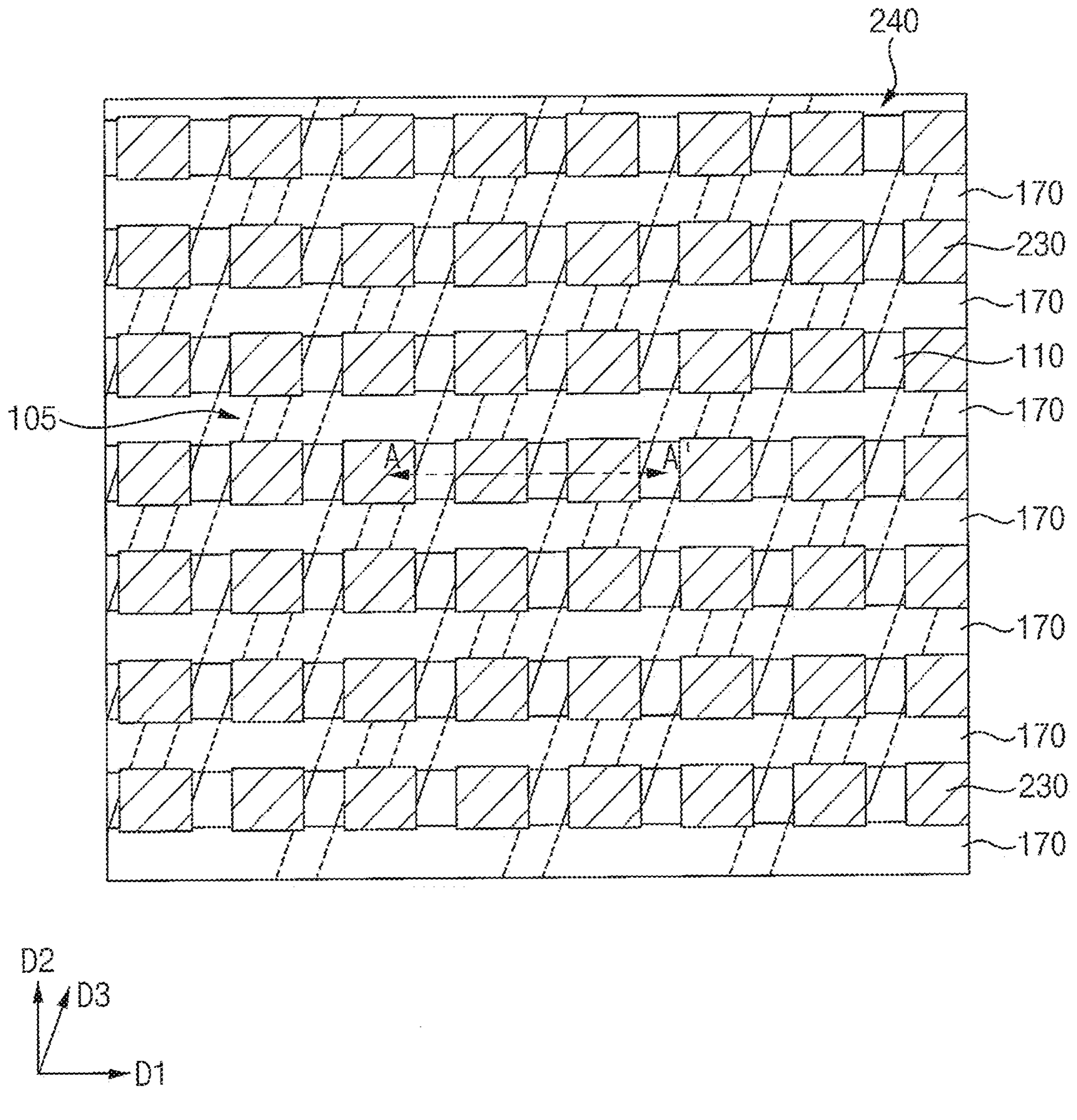
Figure 6:
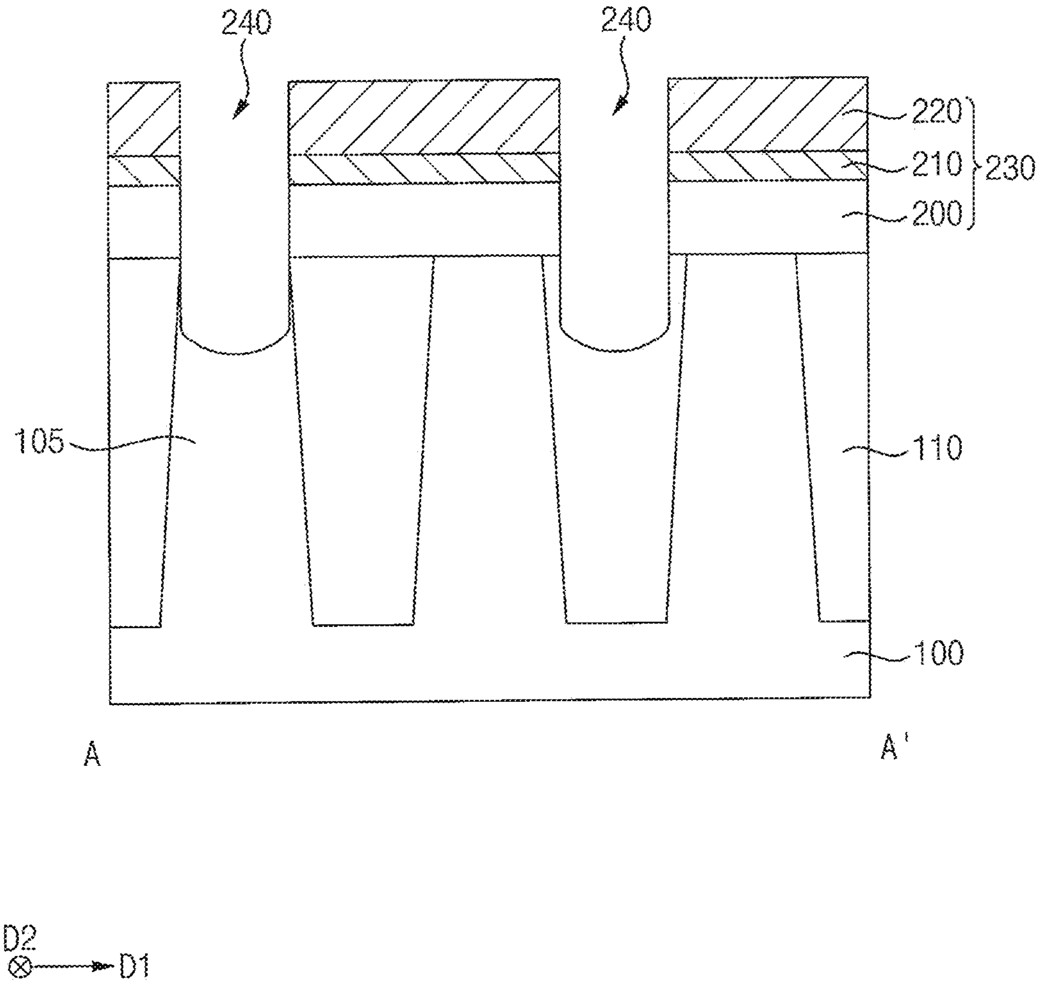

Referring to FIGS. 5 and 6, in example embodiments, a plurality of conductive pad structures 230 may be spaced apart from each other in the first and second directions D1 and D2, and may be arranged in a lattice pattern in a plan view.

In example embodiments, the conductive pad structure 230 may overlap in the third direction an end portion of the active pattern 105 extending in the third direction D3 and a portion of the isolation pattern 110 adjacent to the end portion of the active pattern 105 in the first direction D1.

In example embodiments, the conductive pad structure 230 may include first, second and third conductive pads 200, 210 and 220 sequentially stacked in a vertical direction substantially perpendicular to the upper surface of the substrate 100. In example embodiments, the first conductive pad 200 may include doped polysilicon, the second conductive pad 210 may include a metal silicide, e.g., titanium silicide, cobalt silicide, nickel silicide, etc., a metal nitride, e.g., titanium nitride, tantalum nitride, tungsten nitride, etc., or a metal silicon nitride, e.g., titanium silicon nitride, tantalum silicon nitride, etc., and the third conductive pad 220 may include a metal, e.g., tungsten, ruthenium, etc. Thus, the conductive pad structure 230 may have a multi-layered structure.

Figure 7:
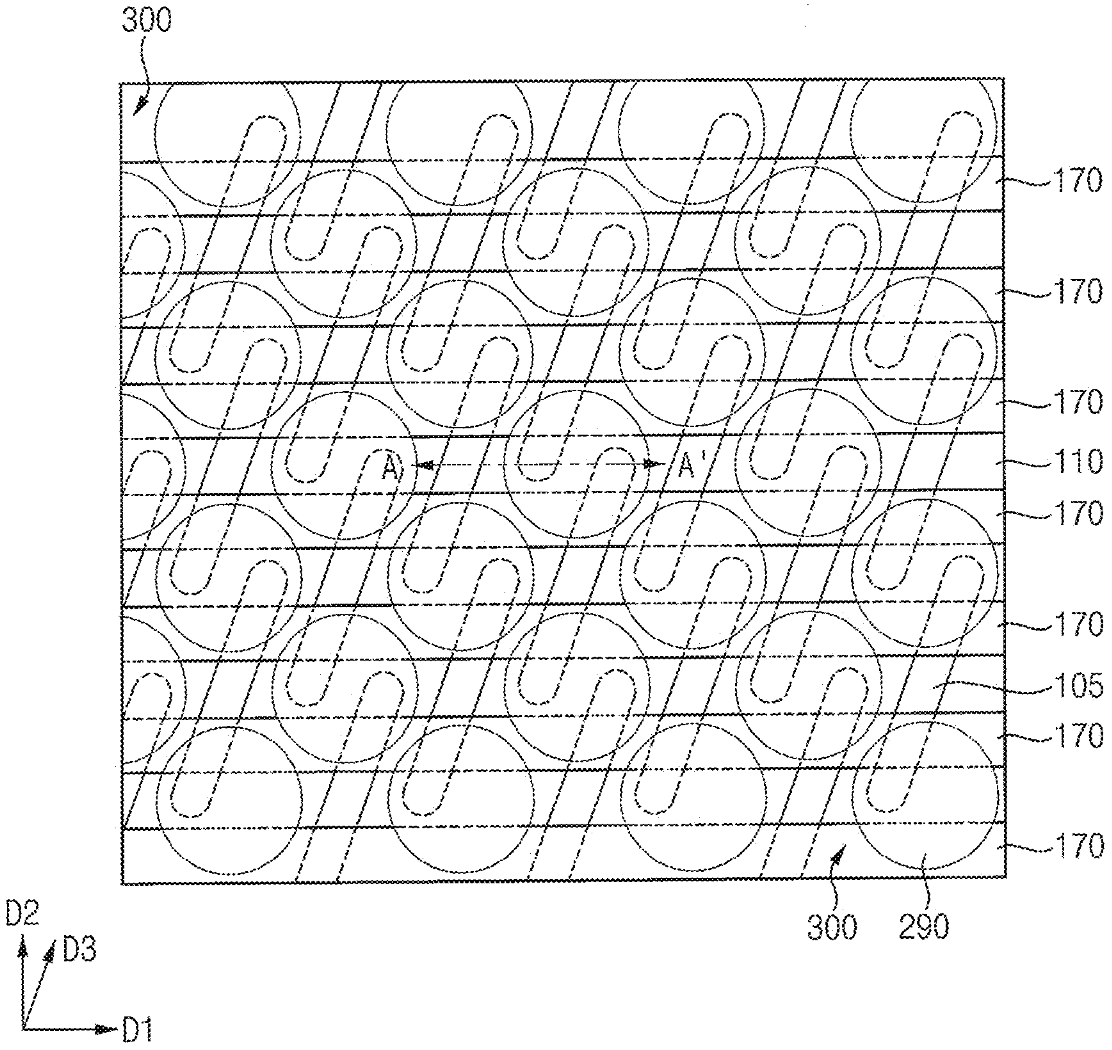
Figure 8:
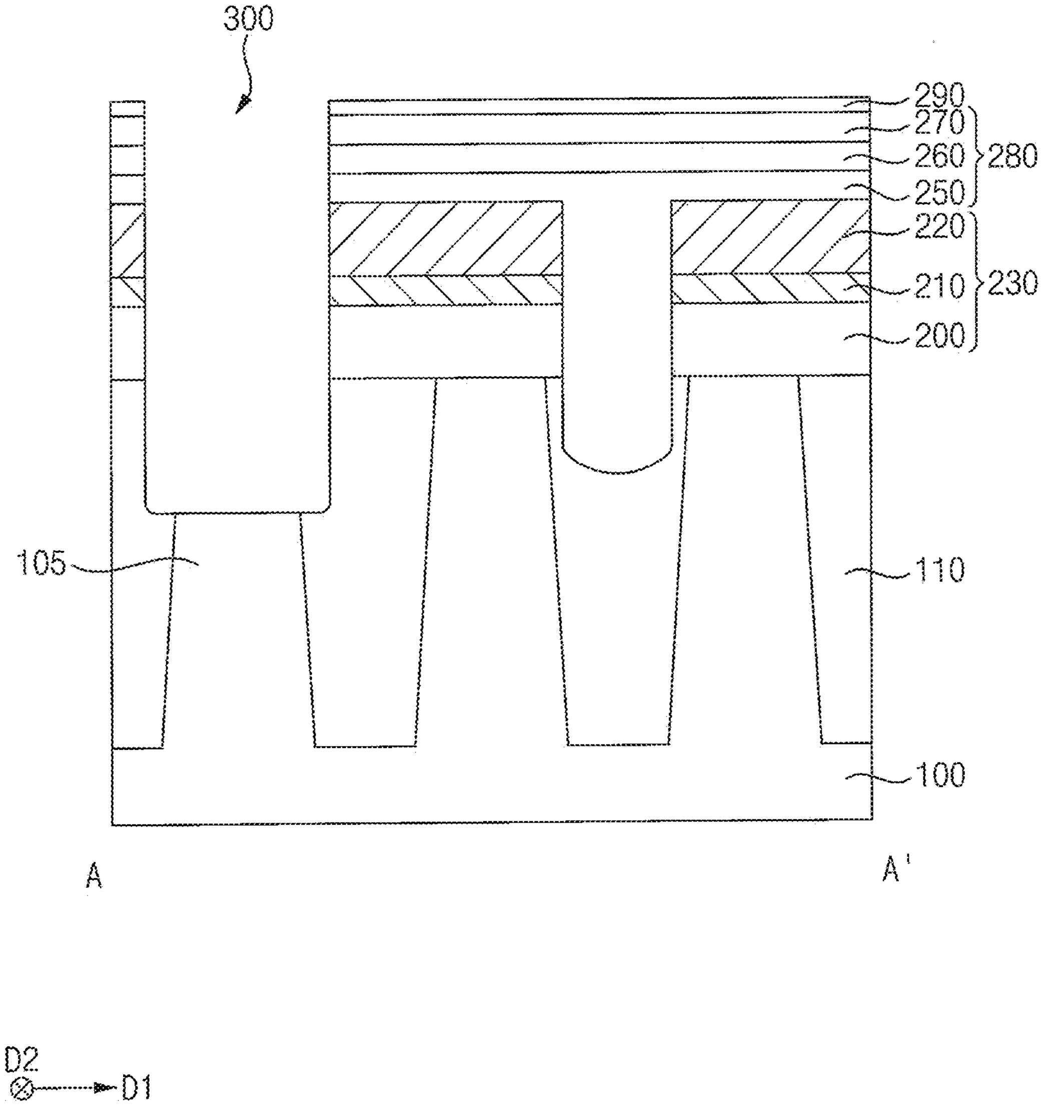

Referring to FIGS. 7 and 8, the first insulation layer 250 may be formed in a first opening 240 extending through the conductive pad structure 230 to expose an upper surface of the active pattern 105 or an upper surface of the isolation pattern 110, and the second and third insulation layers 260 and 270 may be stacked on the first insulation layer 250.

The first to third insulation layers 250, 260 and 270 sequentially stacked may collectively form the insulating pad layer structure 280. In example embodiments, a plurality of insulating pad structures 280 may be spaced apart from each other in the first and second directions D1 and D2.

In example embodiments, the first and third insulation pad layers 250 and 270 may include an insulating nitride, e.g., silicon nitride, and the second insulation pad layer 260 may include a metal oxide, e.g., hafnium oxide, zirconium oxide, etc.

Referring to FIGS. 7 and 8, a second opening 300 may be formed through the conductive pad structure 230 to expose upper surfaces of the active pattern 105, the isolation pattern 110 and the gate mask 160 included in the gate structure 170, and an upper surface of a central portion of the active pattern 105 in the third direction D3 may be exposed by the second opening 300.

In an example embodiment, an area of a lower surface of the second opening 300 may be greater than an area of the upper surface of the active pattern 105 exposed by the second opening 300. Thus, the second opening 300 may also expose an upper surface of a portion of the isolation pattern 110 adjacent to the active pattern 105.

In example embodiments, the filling structure may be formed in the second opening 300, and may include a conductive filling pattern 350 and an insulating filling pattern 460 covering a sidewall of the conductive filling pattern 350.

The conductive filling pattern 350 may be formed between and contacting the upper surface of the central portion of the active pattern 105 in the third direction D3 and a lower surface of the bit line structure 420. The conductive filling pattern 350 may include an insulating nitride, e.g., silicon nitride.

In example embodiments, the bit line structure 420 may extend in the second direction D2, and a plurality of bit line structures 420 may be spaced apart from each other in the first direction D1.

In example embodiments, the bit line structure 420 may be formed on the conductive filling pattern 350 and the insulating pad structure 285. The bit line structure 420 may overlap the central portion of each of the active patterns 105 in the third direction D3.

In example embodiments, the bit line structure 420 may include a third conductive pattern 360, a second barrier pattern 370, a fourth conductive pattern 380, a second mask 390, a second etch stop pattern 400 and a first capping pattern 410 sequentially stacked in the vertical direction. The third conductive pattern 360, the second barrier pattern 370 and the fourth conductive pattern 380 sequentially stacked may collectively form a conductive structure, and the second mask 390, the second etch stop pattern 400 and the first capping pattern 410 sequentially stacked may collectively form an insulation structure. In an example embodiment, the second mask 390, the second etch stop pattern 400 and the first capping pattern 410 sequentially stacked may be merged with each other to form a single insulation structure.

The third conductive pattern 360 may include, e.g., polysilicon doped with n-type or p-type impurities, the second barrier pattern 370 may include a metal silicon nitride, e.g., titanium silicon nitride, the fourth conductive pattern 380 may include a metal, e.g., tungsten, titanium, tantalum, ruthenium, etc., and each of the second mask 390, the second etch stop pattern 400 and the first capping pattern 410 may include an insulating nitride, e.g., silicon nitride.

In example embodiments, first, second and third nitrogen-containing portions 360*a*, 370*a* and 380*a* may be formed at a lateral portion of the bit line structure 420, particularly, at lateral portions of the third conductive pattern 360, the second barrier pattern 370 and the fourth conductive pattern 380, respectively. The first, second and third nitrogen-containing portions 360*a*, 370*a* and 380*a* may be collectively referred to as a nitrogen-containing conductive portion 430.

For example, the first nitrogen-containing portion 360*a* may include doped polysilicon containing nitrogen, the third nitrogen-containing portion 380*a* may include a metal containing nitrogen. A concentration of nitrogen included in the second nitrogen-containing portion 370*a* may be greater than or equal to a concentration of nitrogen included in other portions of the second barrier pattern 370.

The spacer structure 490 may include a first spacer 470 and a second spacer 480 stacked in the horizontal direction on each of opposite sidewalls of the bit line structure 420 in the first direction D1. The first spacer 470 may cover an upper surface of a portion of the insulating filling pattern 460 included in the filling structure, and the second spacer 480 may cover an upper surface of a remaining portion of the insulating filling pattern 460 included in the filling structure.

The first spacer 470 may include an oxide, e.g., silicon oxide, and the second spacer 480 may include an insulating nitride, e.g., silicon nitride.

In example embodiments, an upper surface of the spacer structure 490 may be higher than an upper surface of the conductive structure included in the bit line structure 420. The first spacer 470 may contact the nitrogen-containing conductive portion 430 at the lateral portion of the bit line structure 420.

The third spacer 520 may cover an upper sidewall of the bit line structure 420, and may contact an upper surface of the spacer structure 490. The third spacer 520 may include an insulating nitride, e.g., silicon nitride.

In example embodiments, a plurality of second capping patterns 505 may be spaced apart from each other between neighboring ones of the bit line structures 420 in the first direction D1, and the contact plug structure may be formed between neighboring ones of the second capping patterns 505 in the second direction D2.

The second capping pattern 505 may include an insulating nitride, e.g., silicon nitride.

The contact plug structure may include a lower contact plug 510, a metal silicide pattern 530 and an upper contact plug 565 sequentially stacked in the vertical direction on the conductive pad structure 230.

The lower contact plug 510 may contact the conductive pad structure 230 to be electrically connected to the active pattern 105. The lower contact plug 510 may include, e.g., doped polysilicon, and the metal silicide pattern 530 may include a metal silicide, e.g., titanium silicide, cobalt silicide, nickel silicide, etc.

In an example embodiment, the upper contact plug 565 may include a second metal pattern 555 and a third barrier pattern 545 covering a lower surface and a sidewall of the second metal pattern 555. The second metal pattern 555 may include a metal, e.g., tungsten, and the third barrier pattern 545 may include a metal nitride, e.g., titanium nitride, tantalum nitride, tungsten nitride, etc.

In example embodiments, a plurality of upper contact plugs 565 may be spaced apart from each other in the first and second directions D1 and D2, and may be arranged in a honeycomb pattern or a lattice pattern. Each of the upper contact plugs 565 may have a shape of a circle, an ellipse or a polygon.

Figure 22:
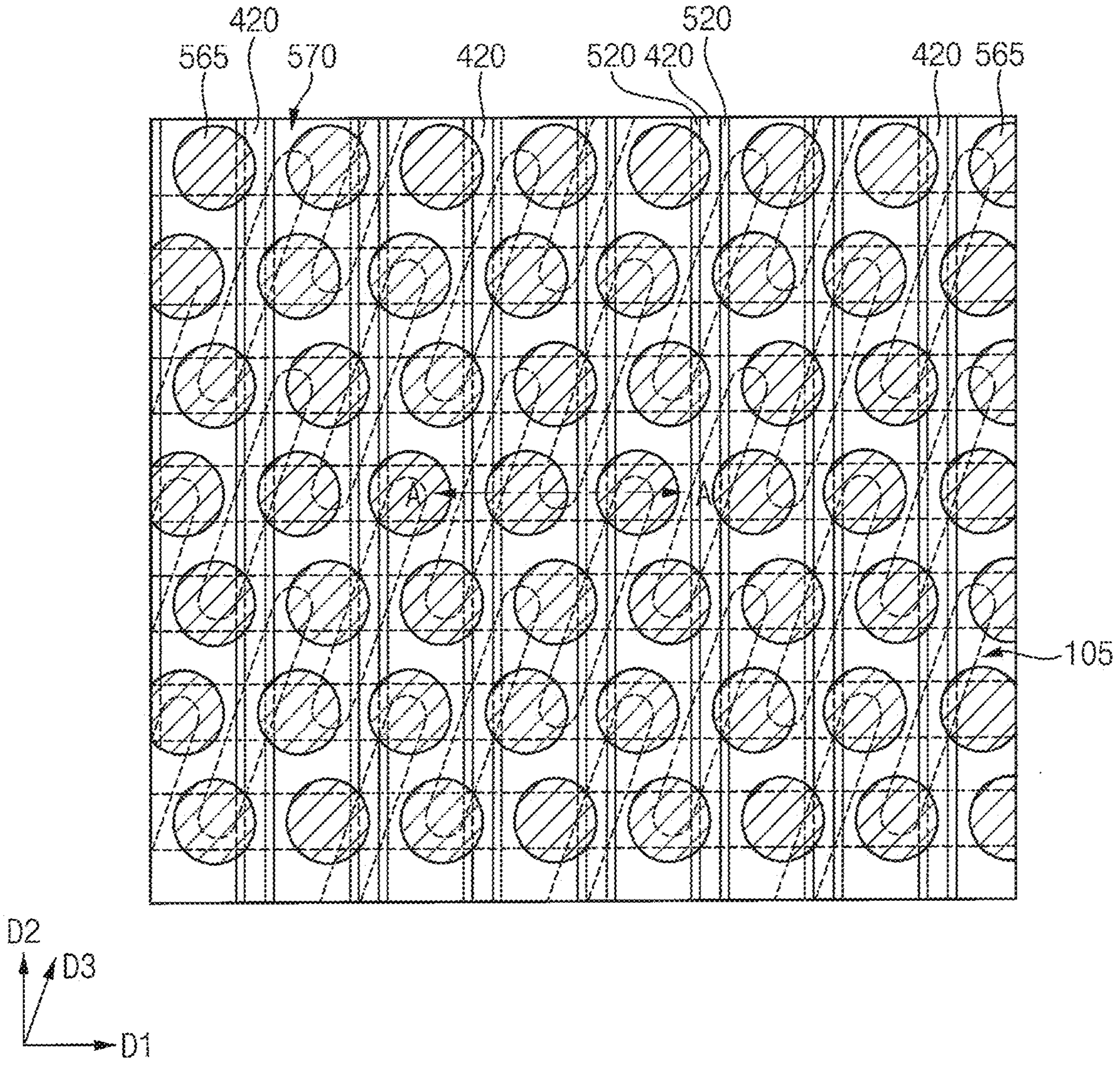
Figure 23:
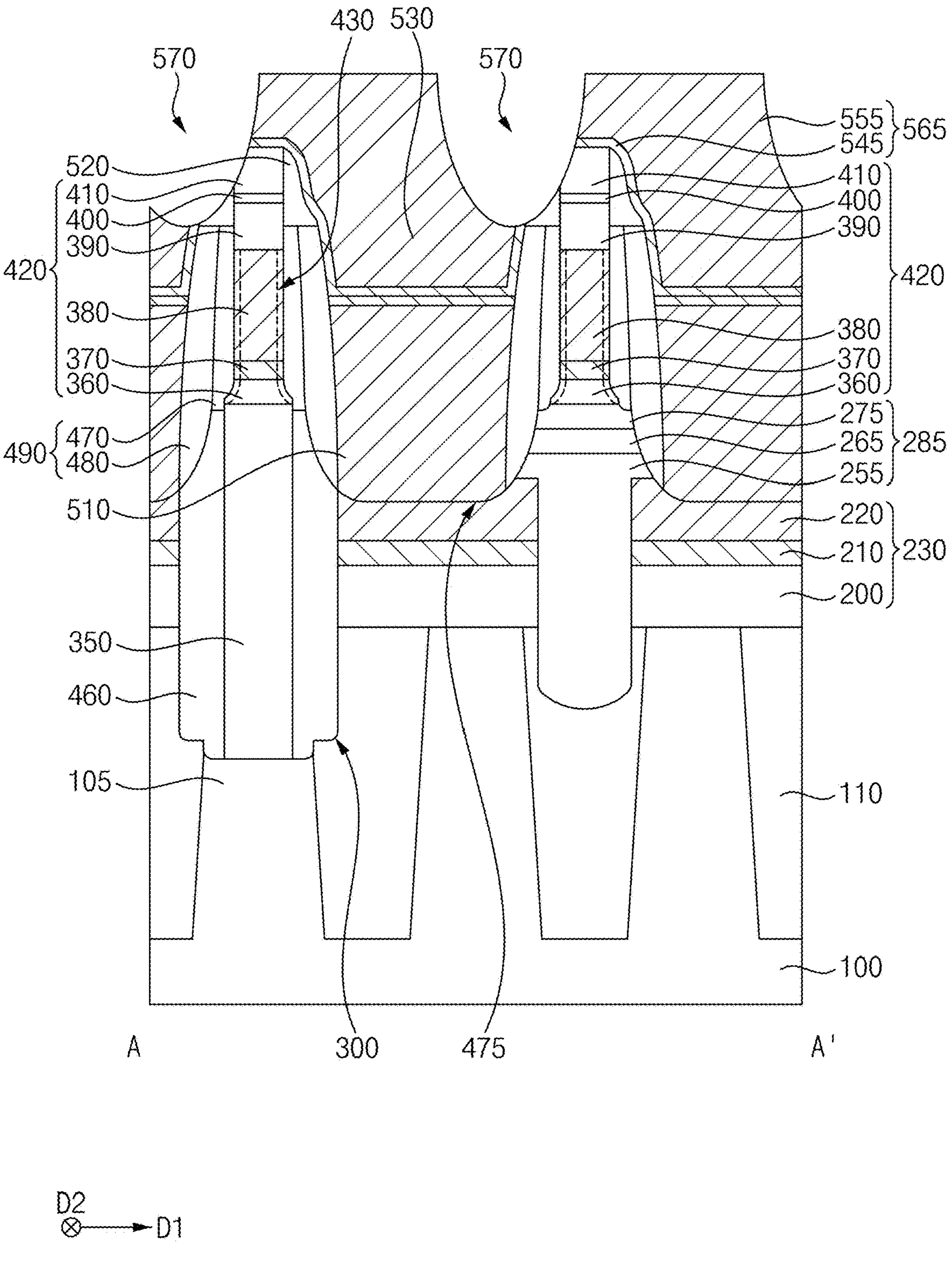

Referring to FIGS. 22 and 23, the insulation pattern 580 may be formed in a seventh opening 570 extending through the upper contact plug 565, a portion of the insulation structure included in the bit line structure 420 and a portion of the third spacer 520 and surrounding the upper contact plug 565 in a plan view. The insulation pattern 580 may include an insulating nitride, e.g., silicon nitride, or an oxide, e.g., silicon oxide.

The third etch stop layer 590 may be formed on the insulation pattern 580. The third etch stop layer 590 may include an insulating nitride, e.g., silicon boronitride (SiBN).

The capacitor 630 may be formed on the upper contact plug 565, and may include a lower electrode 600 having a pillar shape or a cylindrical shape, a dielectric layer 610 on a surface of the lower electrode 600, and an upper electrode 620 on the dielectric layer 610.

The lower electrode 600 may include, e.g., a metal, a metal nitride, a metal silicide, doped polysilicon, the dielectric layer 610 may include, e.g., a metal oxide, and the upper electrode 620 may include, e.g., a metal, a metal nitride, a metal silicide, doped silicon-germanium, etc. In an example embodiment, the upper electrode 620 may include a first electrode including a metal or a metal nitride, and a second upper electrode including doped silicon-germanium.

In the semiconductor device, the nitrogen-containing conductive portion 430 may be formed at the lateral portion of the conductive structure included in the bit line structure 420, and the spacer structure 490 including the first and second spacers 470 and 480 stacked in the horizontal direction may be formed on the sidewall of the bit line structure.

If the spacer structure including the first and second spacers 470 and 480 and an additional nitride spacer is formed on the sidewall of the bit line structure 420, a space for forming the contact plug structure between the bit line structures may decrease, and the parasitic capacitance between the bit line structures 420 may increase due to the addition of the nitride spacer having a relatively high dielectric constant.

However, in example embodiments, the spacer structure 490 including only the first and second spacers 470 and 480 may be formed on the sidewall of the bit line structure 420, and thus the space for forming the contact plug structure may increase. Additionally, the parasitic capacitance between the bit line structures 420 may decrease because the nitride spacer having a relatively high dielectric constant is not added to the spacer structure.

As illustrated below, even though the additional nitride spacer is not formed on the spacer structure on the sidewall of the bit line structure, oxidation of the sidewall of the bit line structure may be limited and/or prevented.

FIGS. 3 to 23 are plan views and cross-sectional views illustrating a method of manufacturing a semiconductor device in accordance with example embodiments. Particularly, FIGS. 3, 5, 7, 18 and 22 are the plan views, FIG. 4 includes cross-sections taken along lines A-A' and B-B' of FIG. 3, and FIGS. 6, 8-17, 19-21 and 23 are cross-sectional views taken along lines A-A' of corresponding plan views, respectively. FIG. 11B is an enlarged cross-sectional view of region X of FIG. 11A.

Figure 3:
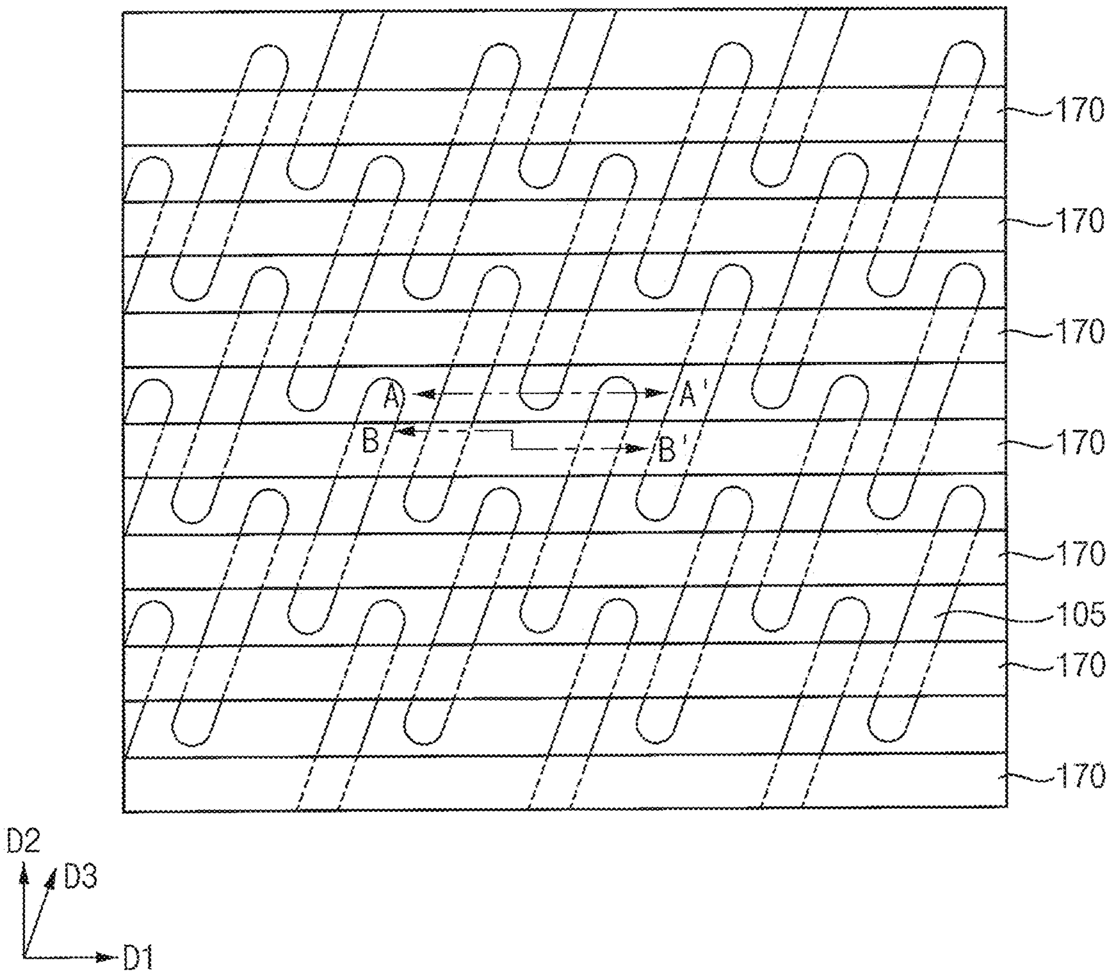
FIGS. 3 to 23 are plan views and cross-sectional views illustrating a method of manufacturing a semiconductor device in accordance with example embodiments.

Referring to FIGS. 3 and 4, an active pattern 105 may be formed on a substrate 100, and an isolation pattern 110 may be formed to cover a sidewall of the active pattern 105.

The active pattern 105 may be formed by removing an upper portion of the substrate 100 to form a first recess, and a plurality of active patterns 105 each of which may extend in the third direction D3 may be formed to be spaced apart from each other in the first and second directions D1 and D2.

The active pattern 105 and the isolation pattern 110 may be partially etched to form a second recess extending in the first direction D1.

A gate structure 170 may be formed in the second recess. The gate structure 170 may include a gate insulation pattern 120, a first barrier pattern 130, a first conductive pattern 140, a second conductive pattern 150 and a gate mask 160.

In example embodiments, the gate structure 170 may extend in the first direction D1, and a plurality of gate structures 170 may be formed to be spaced apart from each other in the second direction D2.

Referring to FIGS. 5 and 6, a conductive pad structure 230 may be formed on the active pattern 105 and the isolation pattern 110.

The conductive pad structure 230 may include first, second and third conductive pads 200, 210 and 220 sequentially stacked in the vertical direction.

The conductive pad structure 230 may be patterned by an etching process to form a first opening 240 exposing upper surfaces of the active pattern 105, the isolation pattern 110 and the gate structure 170, and during the etching process, upper portions of the active pattern 105 and the isolation pattern 110 may also be partially removed.

In example embodiments, the first opening 240 may include a first portion extending in the first direction D1 and a second portion extending in the second direction D2 that may be connected with each other. Thus, a plurality of conductive pad structures 230 may be spaced apart from each other to be arranged in a lattice pattern in a plan view.

In example embodiments, the conductive pad structure 230 may overlap in the vertical direction an end portion of the active pattern 105 extending in the third direction D3 and a portion of the isolation pattern 110 adjacent thereto in the first direction D1.

Referring to FIGS. 7 and 8, an insulating pad layer structure 280 may be formed on the conductive pad structure 230 to fill the first opening 240.

In example embodiments, the insulating pad layer structure 280 may include first, second and third insulation pad layers 250, 260 and 270 sequentially stacked, and the first insulation pad layer 250 may fill the first opening 240.

A first etch stop layer 290 may be formed on the insulating pad layer structure 280, a first mask (not shown) may be formed on the first etch stop layer 290, and the first etch stop layer 290, the insulating pad layer structure 280, the conductive pad structure 230, the active pattern 105, the isolation pattern 110 and the gate mask 160 included in the gate structure 170 may be partially etched by an etching process using the first mask as an etching mask to form a second opening 300, and an upper surface of a portion of the active pattern 105 may be exposed by the second opening 300.

In example embodiments, the first mask may have a shape of, e.g., a circle or an ellipse in a plan view, and a plurality of first masks may be spaced apart from each other in the first and second directions D1 and D2. Each of the first masks may overlap in the vertical direction end portions of neighboring ones of the active patterns 105 in the first direction D1 and a portion of the isolation pattern 110 therebetween.

For example, an ion implantation process may be performed on the exposed portion of the active pattern 105 to form an impurity region. The first mask may be removed.

Figure 9:
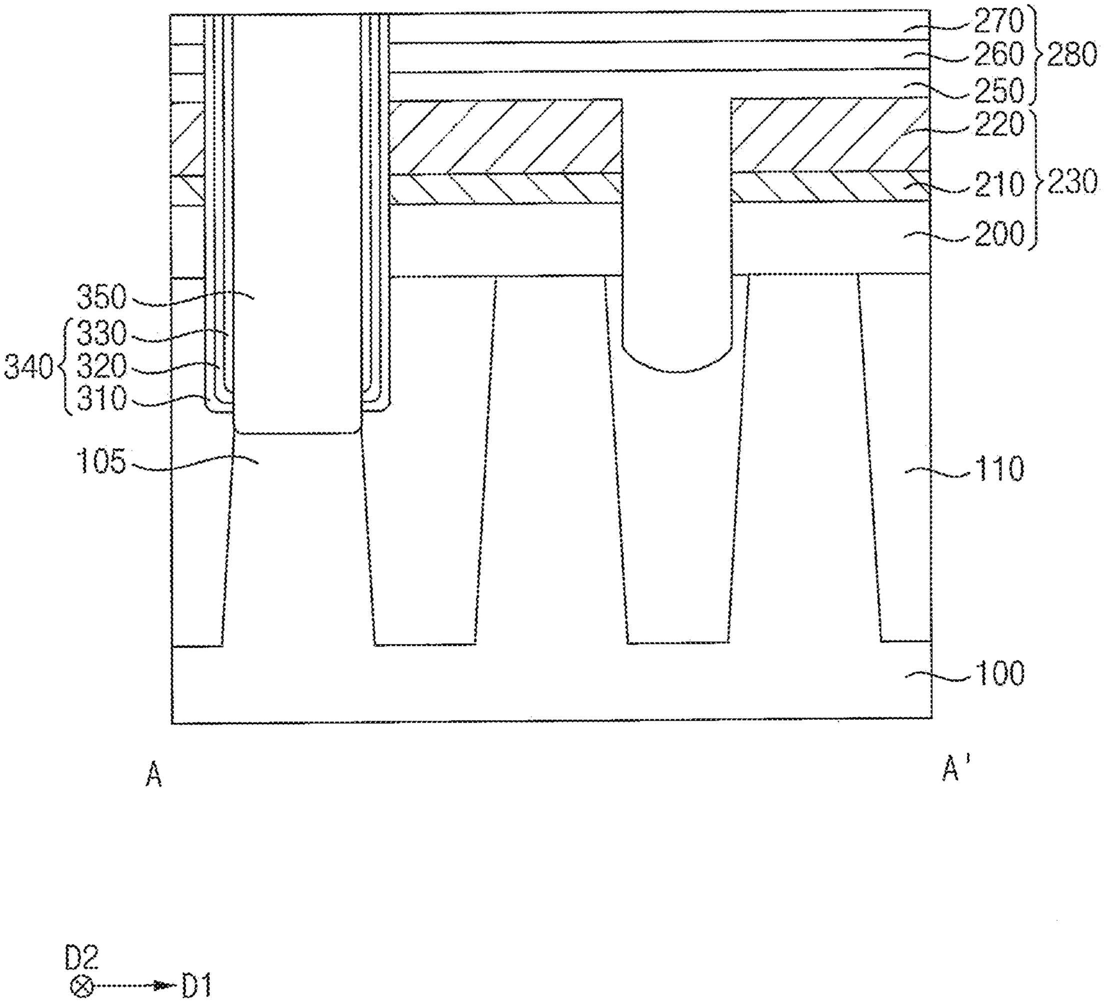

Referring to FIG. 9, first to third sacrificial spacer layers may be sequentially formed on a sidewall and a bottom of the second opening 300 and an upper surface of the first etch stop layer 290, and an anisotropic etching process may be performed on the first to third sacrificial spacer layers.

Thus, a sacrificial spacer structure including first to third sacrificial spacers 310, 320 and 330 may be formed on the sidewall of the second opening 300, and the upper surface of the active pattern 105 and the portion of the isolation pattern 110 adjacent thereto may be exposed again.

During the anisotropic etching process, a portion of the active pattern 105 and a portion of the isolation pattern 110 adjacent thereto may be partially removed, and the first etch stop layer 290 may be removed to expose an upper surface of the insulating pad layer structure 280.

A conductive filling layer may be formed on the exposed portion of the active pattern 105 and the portion of the isolation pattern 110 adjacent thereto and the insulating pad layer structure 280, and may be planarized until the upper surface of the insulating pad layer structure 280 is exposed. Thus, a conductive filling pattern 350 may be formed in the second opening 300 of which a sidewall may be covered by the sacrificial spacer structure 340.

The conductive filling layer may include polysilicon doped with n-type or p-type impurities, a metal, a metal nitride, a metal silicide, etc.

The conductive filling pattern 350 and the sacrificial spacer structure 340 may form a preliminary filling structure.

In example embodiments, the planarization process may include a chemical mechanical polishing (CMP) process and/or an etch back process.

Figure 10:
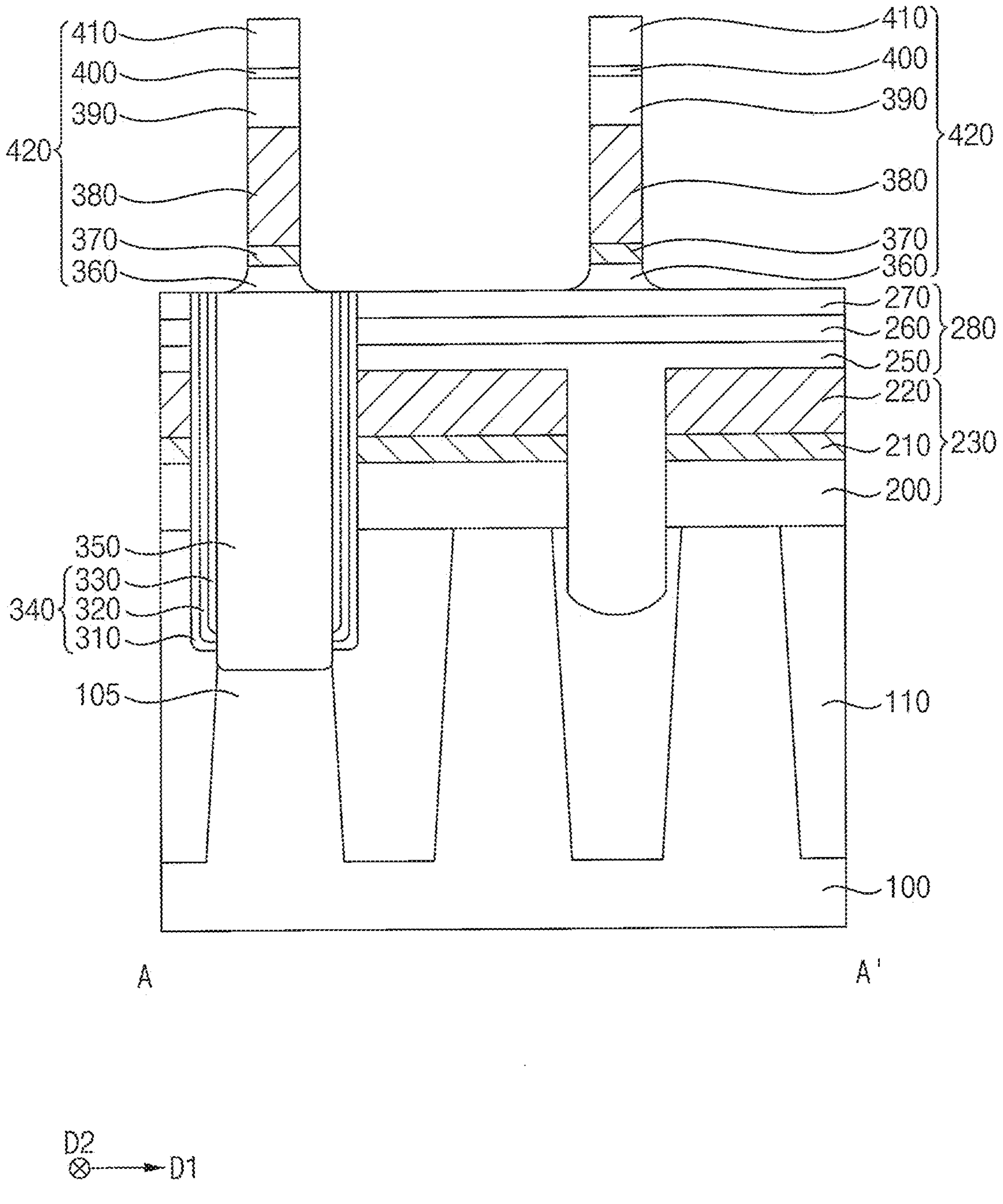

Referring to FIG. 10, a third conductive layer, a second barrier layer, a fourth conductive layer, a second mask layer, a second etch stop layer and a first capping layer may be sequentially formed on the insulating pad layer structure 280 and the preliminary filling structure, the first capping layer may be patterned to form a first capping pattern 410, and the second etch stop layer, the second mask layer, the fourth conductive layer, the second barrier layer and the third conductive layer may be sequentially etched using the first capping pattern 410 as an etching mask.

By the etching process, a bit line structure 420 including a third conductive pattern 360, a second barrier pattern 370, a fourth conductive pattern 380, a second mask 390, a second etch stop pattern 400 and the first capping pattern 410 sequentially stacked may be formed on the insulating pad layer structure 280 and the preliminary filling structure.

In example embodiments, the third conductive pattern 360 may include polysilicon doped with n-type or p-type impurities, the second barrier pattern 370 may include a metal silicon nitride, e.g., titanium silicon nitride, the fourth conductive pattern 380 may include a metal, e.g., tungsten, titanium, tantalum, etc., and each of the second mask 390, the second etch stop pattern 400 and the first capping pattern 410 may include an insulating nitride, e.g., silicon nitride, silicon oxynitride, etc.

The bit line structure 420 may include a conductive structure having the third conductive pattern 360, the second barrier pattern 370 and the fourth conductive pattern 380, and an insulation structure having the second mask 390, the second etch stop pattern 400 and the first capping pattern 410. In an example embodiment, the second mask 390, the second etch stop pattern 400 and the first capping pattern 410 sequentially stacked may be merged with each other to form a single insulation structure.

In example embodiments, the bit line structure 420 may extend in the second direction D2 on the substrate 100, and a plurality of bit line structures 420 may be spaced apart from each other in the first direction D1.

Figure 11A:
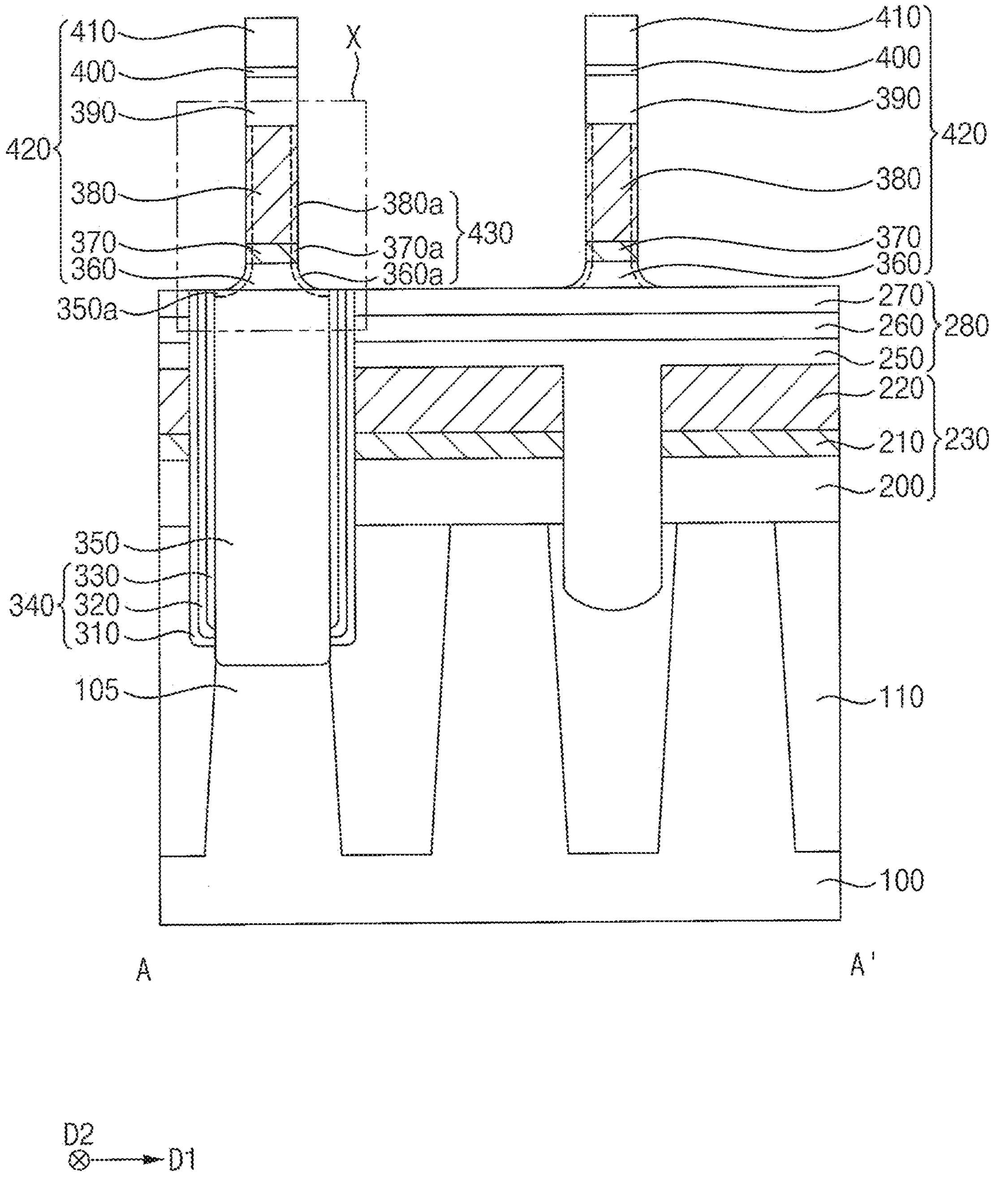
Figure 11B:
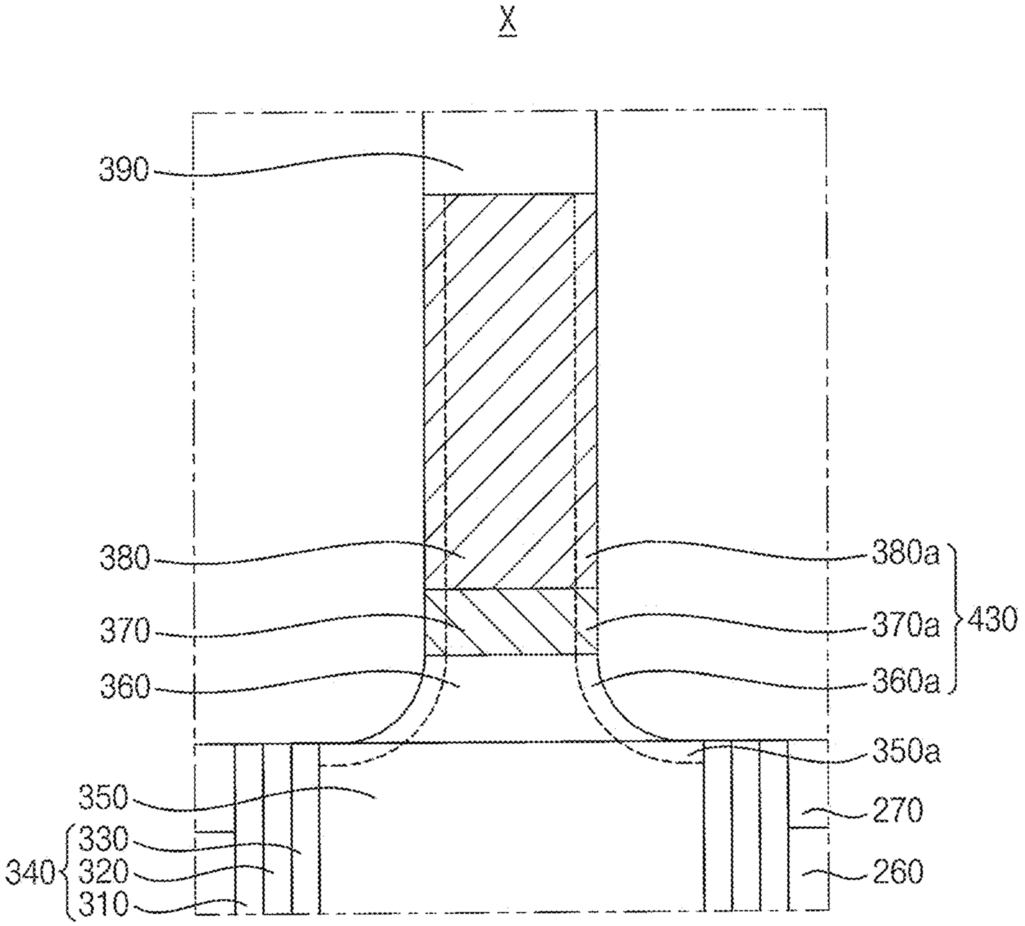

Referring to FIGS. 11A and 11B, a nitrogen source gas, e.g., hexachlorodisilane (HCD) gas may be provided onto a surface of the bit line structure 420.

Thus, nitrogen may penetrate into a lateral portion of the bit line structure 420, particularly, a lateral portion of the conductive structure, that is, lateral portions of the third conductive pattern 360, the second barrier pattern 370 and the fourth conductive pattern 380, so that first, second and third nitrogen-containing portions 360*a*, 370*a* and 380*a* may be formed. The first to third nitrogen-containing portions 360*a*, 370*a* and 380*a* may be collectively referred to as a nitrogen-containing conductive portion 430.

For example, the first nitrogen-containing portion 360*a* may include doped polysilicon containing nitrogen, the third nitrogen-containing portion 380*a* may include a metal containing nitrogen. A concentration of a nitrogen included in the second nitrogen-containing portion 370*a* may be greater than or equal to a concentration of nitrogen included in other portions of the second barrier pattern 370.

A fourth nitrogen-containing portion 350*a* including doped polysilicon containing nitrogen or a metal containing nitrogen may be formed on a surface of the conductive filling pattern 350.

Figure 12:
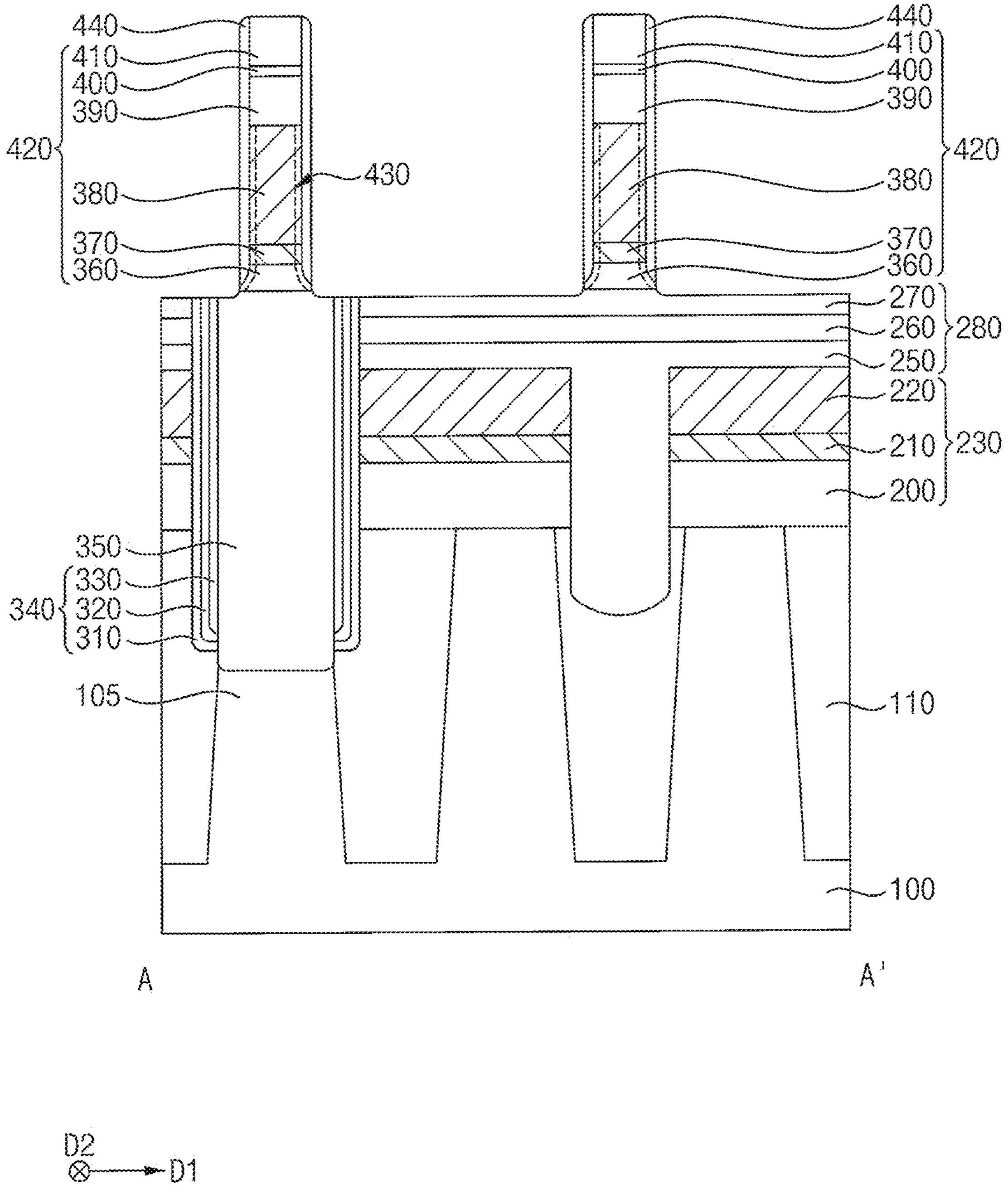

Referring to FIG. 12, a sacrificial etch stop layer may be formed on the bit line structure 420, the conductive filling pattern 350, and the insulating pad layer structure 280, and may be anisotropically etched.

Thus, a sacrificial etch stop pattern 440 may remain on the sidewall of the bit line structure 420, and a portion of the sacrificial spacer layer on the conductive filling pattern 350 and the insulating pad layer structure 280 may be removed.

In example embodiments, the sacrificial spacer layer may include, e.g., silicon oxycarbide (SiOC).

During the anisotropic etching process, an upper portion of the insulating pad layer structure 280 and the fourth nitrogen-containing portion 350*a* may also be removed.

Figure 13:
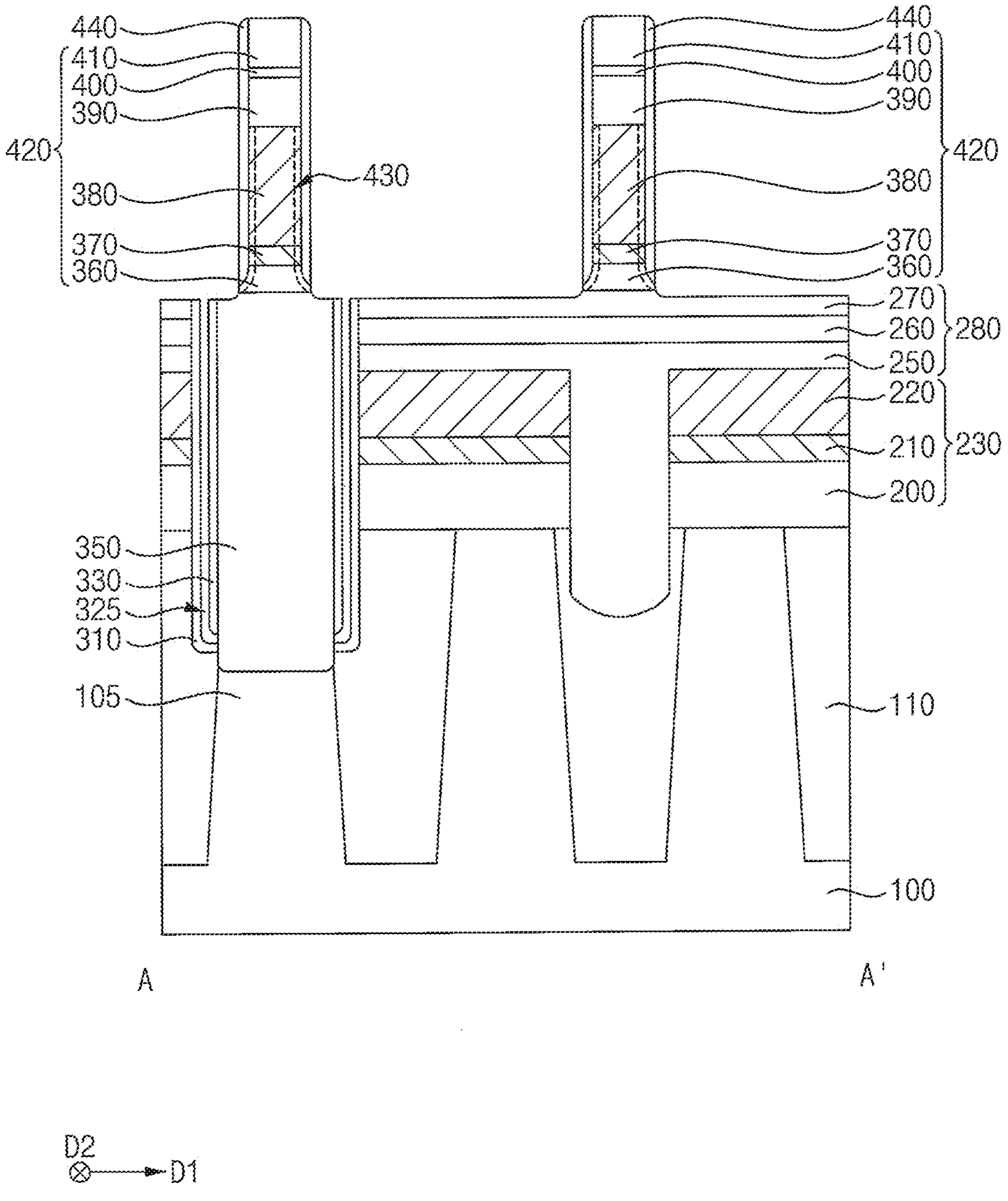

Referring to FIG. 13, the second sacrificial spacer 320 included in the sacrificial spacer structure 340 may be removed.

In example embodiments, the second sacrificial spacer 320 may be removed by an etching process or a cleansing process, and thus a gap 325 may be formed between the first and third sacrificial spacers 310 and 330.

During the etching process or the cleansing process, the sacrificial etch stop pattern 440 on the sidewall of the bit line structure 420 may cover and protect the bit line structure 420.

Figure 14:
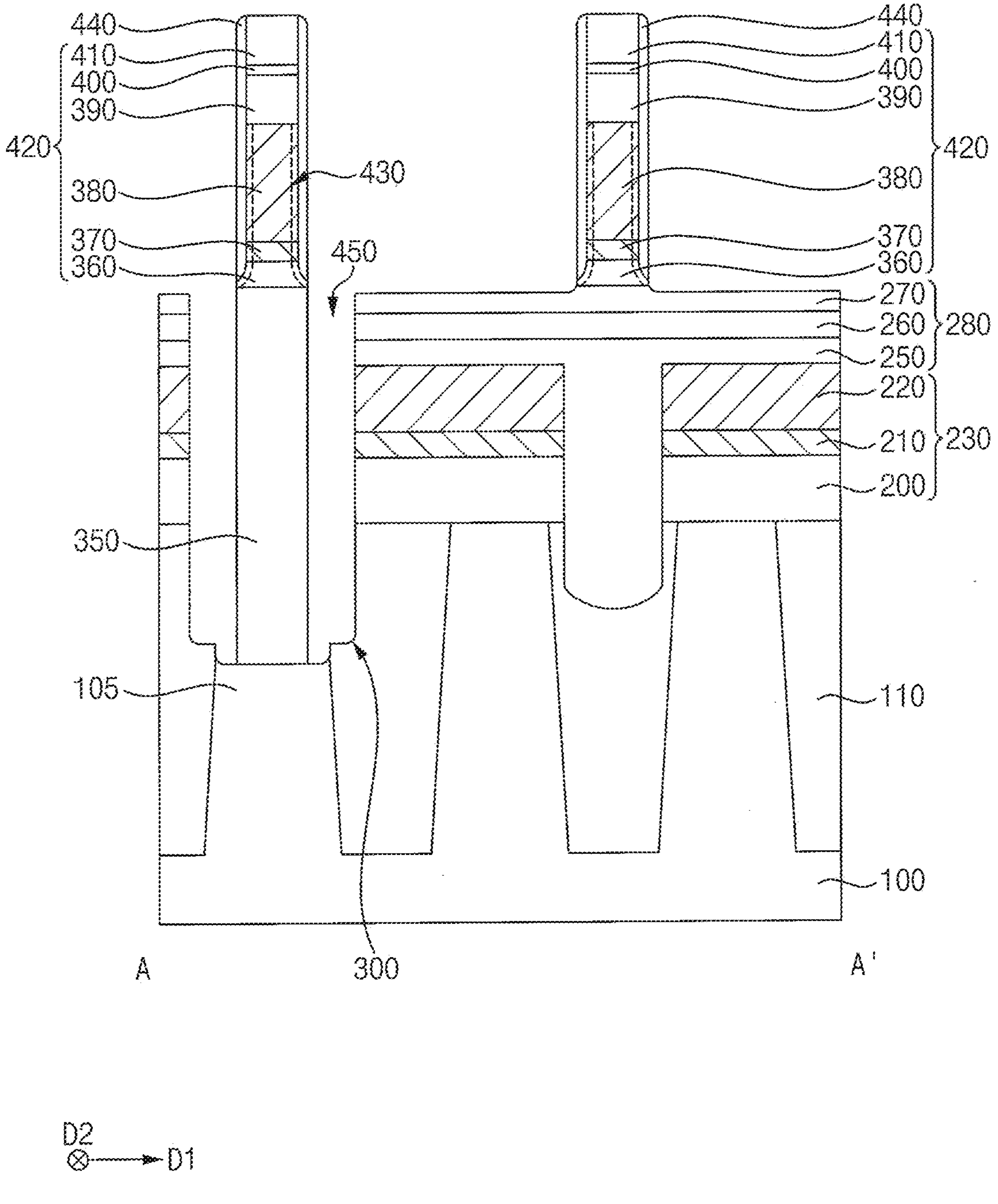

Referring to FIG. 14, a dry etching process may be performed on the conductive filling pattern 350 using the bit line structure 420 and the sacrificial etch stop pattern 440 as an etching mask.

During the dry etching process, the first and third sacrificial spacers 310 and 330 may also be removed, and thus a third recess 450 may be formed in the second opening 300 to expose a sidewall of the conductive filling pattern 350.

Figure 15:
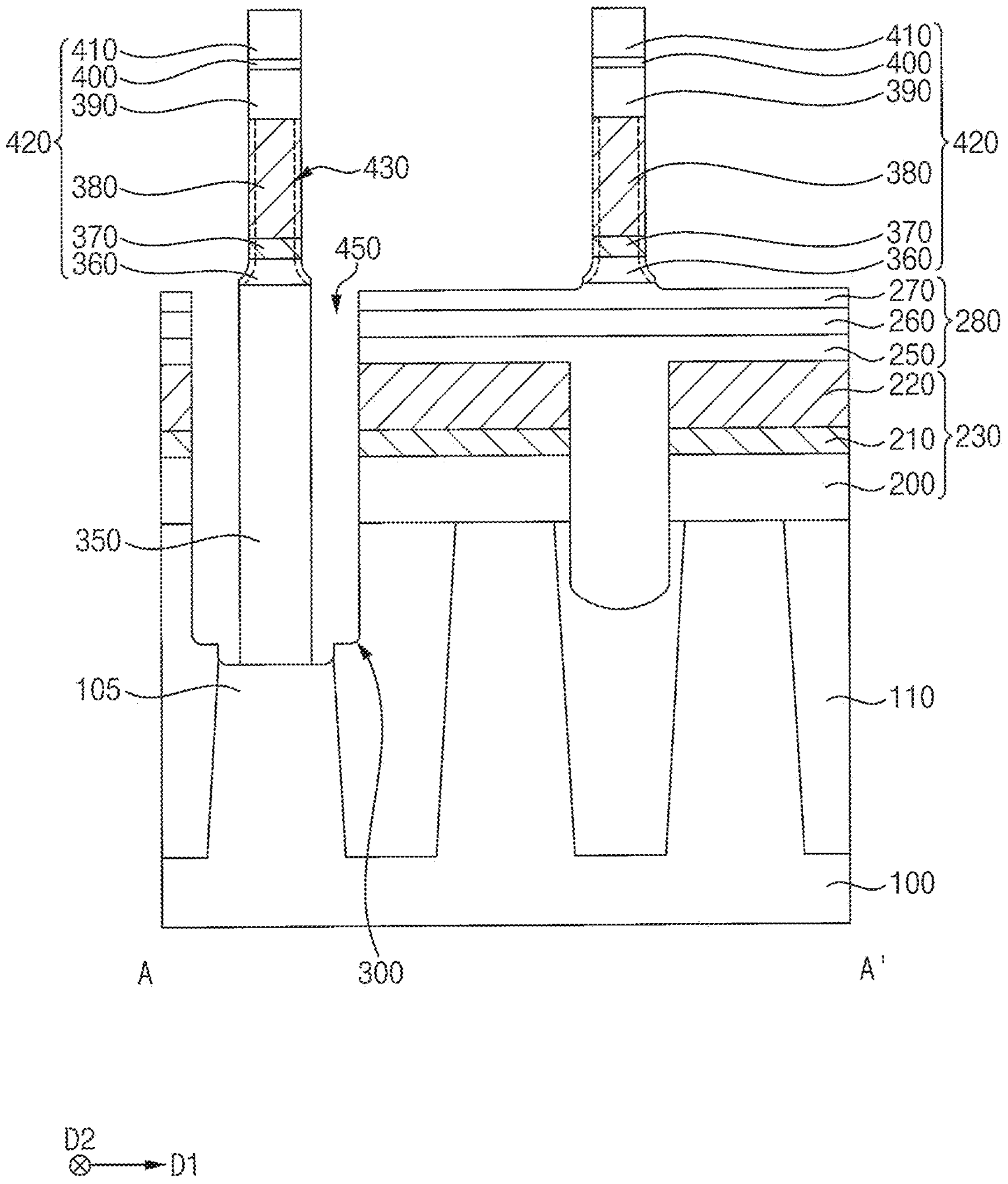

Referring to FIG. 15, the sacrificial etch stop pattern 440 may be removed.

In example embodiments, the sacrificial etch stop pattern 440 may be removed by, e.g., an ashing process using oxygen and/or a stripping process using hydrofluoric acid (HF).

During the ashing process, since the nitrogen-containing conductive portion 430 is formed at the lateral portion of the conductive structure included in the bit line structure 420, oxidation by oxygen may be limited and/or prevented.

Figure 16:
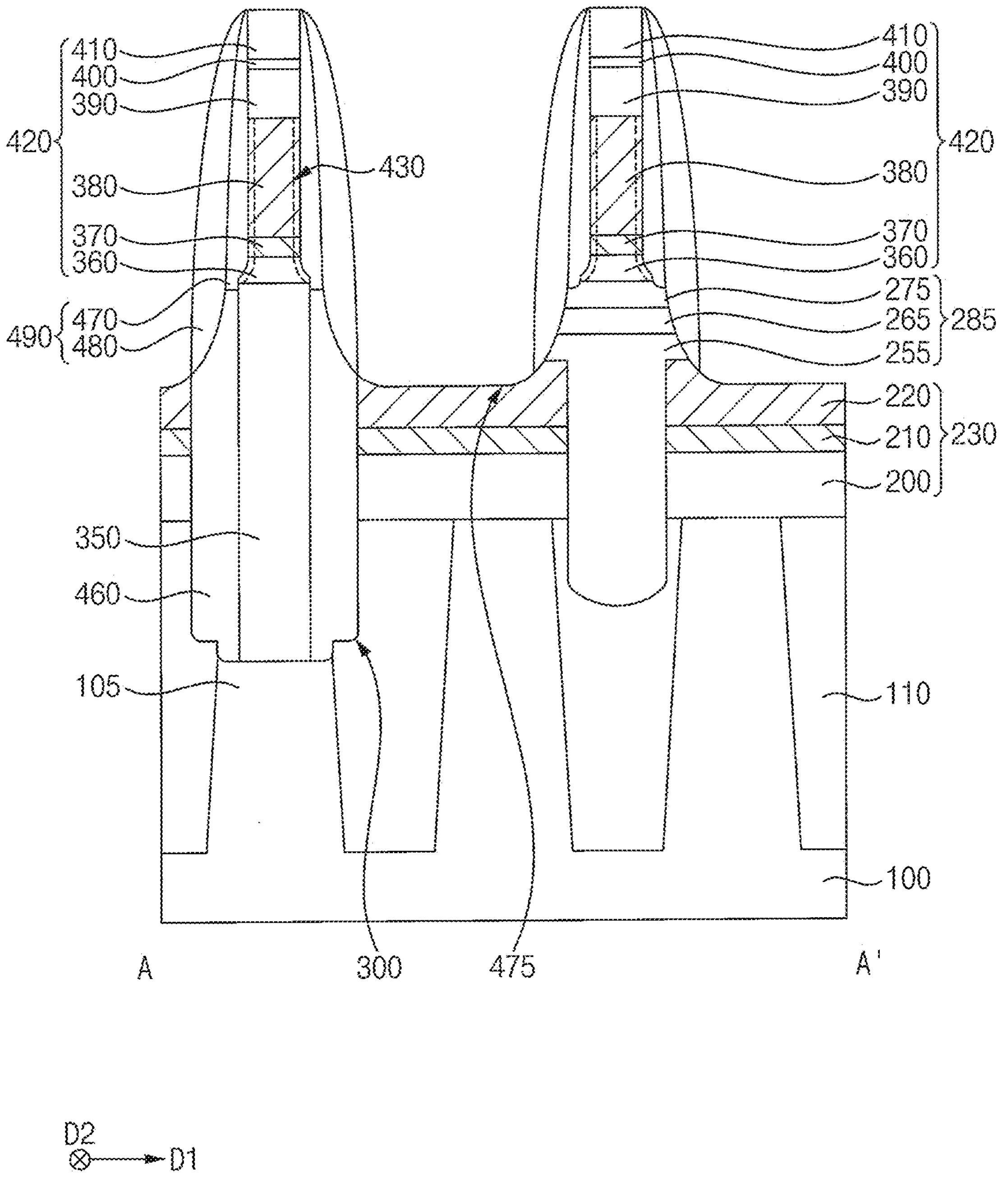

Referring to FIG. 16, an insulating filling pattern 460 may be formed to fill the third recess 450, a first spacer layer may be formed on the bit line structure 420, the insulating filling pattern 460 and the insulating pad layer structure 280, and may be anisotropically etched to form a first spacer 470 on the sidewall of the bit line structure 420. The first spacer 470 may contact the nitrogen-containing conductive portion 430 at the lateral portion of the conductive structure included in the bit line structure 420.

The conductive filling pattern 350 and the insulating filling pattern 460 in the second opening 300 may form a filling structure.

The first spacer layer may include an oxide, e.g., silicon oxide.

The insulating filling pattern 460 and the insulating pad layer structure 280 may be etched using the bit line structure 420 and the first spacer 470 as an etching mask to form a third opening 475 exposing an upper surface of the conductive pad structure 230. Thus, the insulating pad layer structure 280 may be transformed into an insulating pad structure 285 including first, second and third insulation pads 255, 265 and 275 sequentially stacked in the vertical direction.

A second spacer layer may be formed on an upper surface of the bit line structure 420, an upper surface and an outer sidewall of the first spacer 470, an upper surface of a portion of the insulating filling pattern 460 and the upper surface of the conductive pad structure 230 exposed by the third opening 475, and may be anisotropically etched to form a second spacer 480 covering the outer sidewall of the first spacer 470 and the upper surface of the portion of the insulating filling pattern 460.

The second spacer layer may include an insulating nitride, e.g., silicon nitride.

The first and second spacers 470 and 480 stacked on the sidewall of the bit line structure 420 may form a spacer structure 490.

Figure 17:
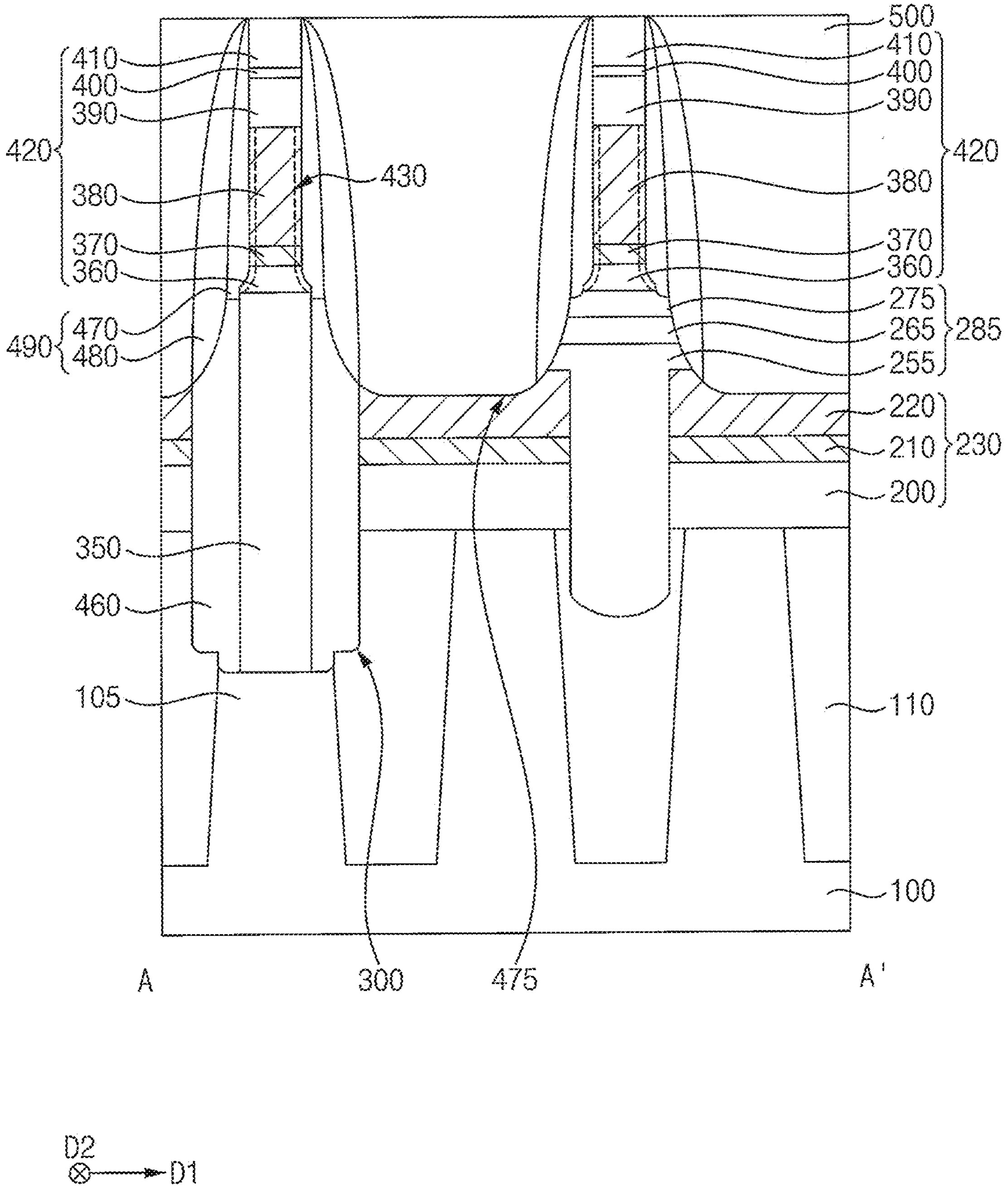

Referring to FIG. 17, a sacrificial layer may be formed on the substrate 100 to fill the third opening 475, and may be planarized until an upper surface of the bit line structure is exposed to form a sacrificial pattern 500. In example embodiments, the sacrificial pattern 500 may extend in the second direction D2, and a plurality of sacrificial patterns 500 may be spaced apart from each other in the first direction D1. The sacrificial pattern 500 may include an oxide, e.g., silicon oxide.

Figure 18:
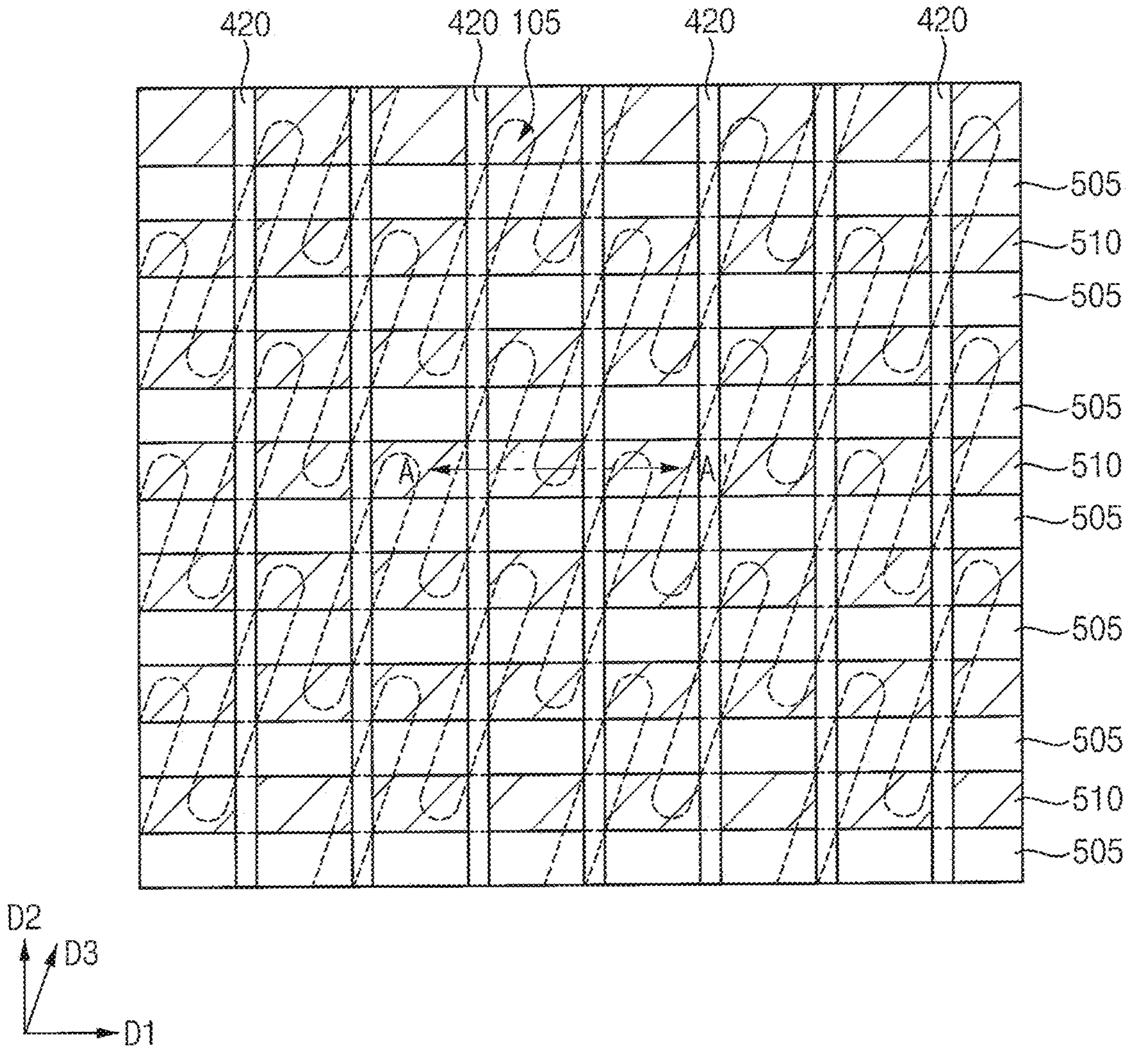
Figure 19:
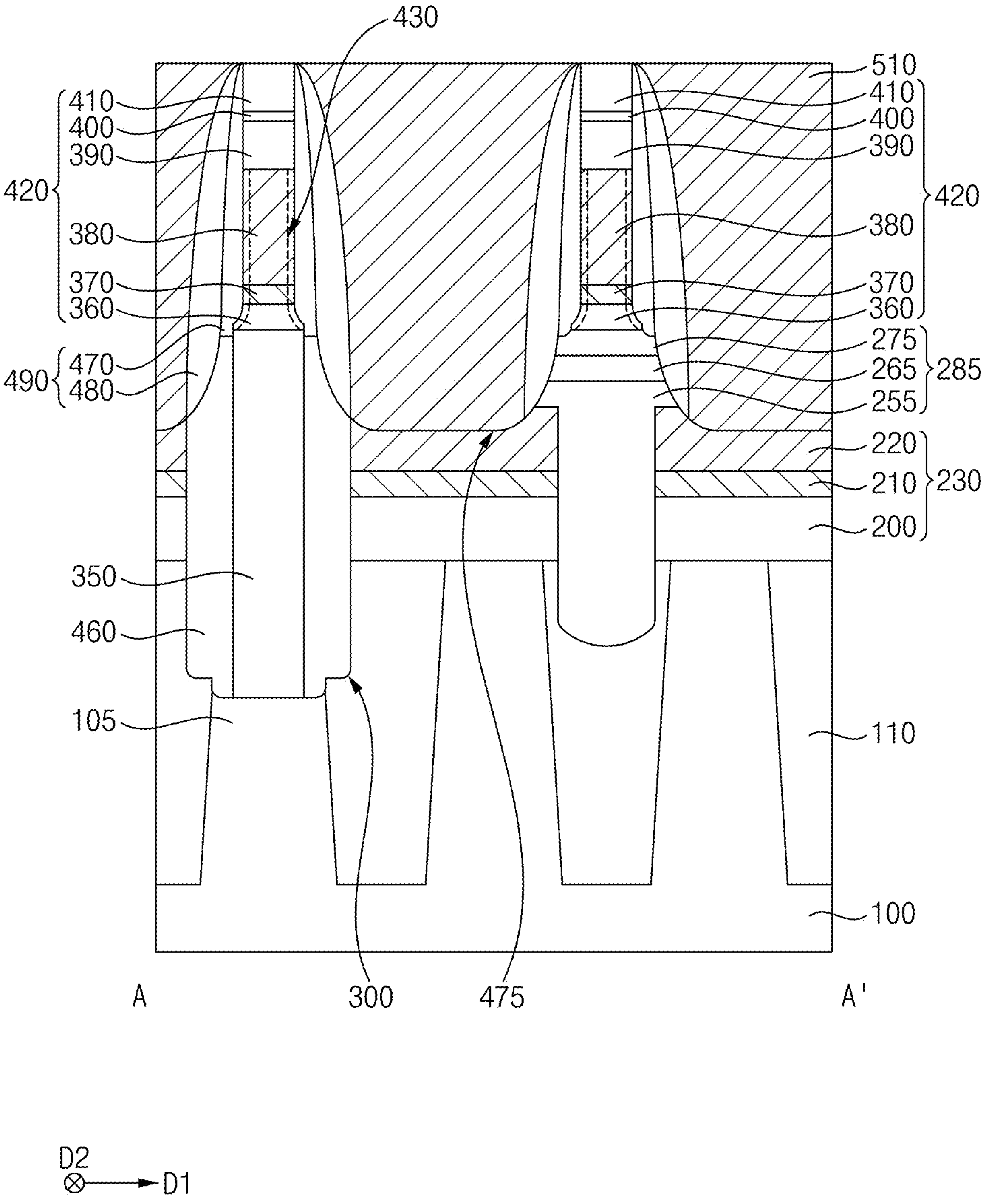

Referring to FIGS. 18 and 19, a third mask including a plurality of fourth openings, each of which may extend in the first direction D1, spaced apart from each other in the second direction D2 may be formed on the bit line structure 420 and the sacrificial pattern 500, and the sacrificial pattern 500 may be etched using the third mask as an etching mask to form a fifth opening exposing an upper surface of the gate mask 160 of the gate structure 170.

In example embodiments, each of the fourth openings may overlap the gate structure 170 in the vertical direction, and a plurality of fifth openings may be spaced apart from each other in the second direction D2 between neighboring ones of the bit line structure 420 in the first direction D1.

After removing the third mask, a second capping pattern 505 may be formed to fill each of the fifth openings. According to the layout of the fifth openings, a plurality of second capping patterns 505 may be spaced apart from each other in the second direction D2 between neighboring ones of the bit line structures 420 in the first direction D1.

The sacrificial pattern 500 may be divided into a plurality of parts spaced apart from each other in the second direction D2 between the bit line structures 420.

The sacrificial patterns 500 may be removed to form sixth openings each of which may partially expose an upper surface of the conductive pad structure 230. A plurality of sixth openings may be spaced apart from each other in the second direction D2 between the bit line structures 420.

A lower contact plug layer may be formed to fill the sixth openings, and may be planarized until upper surfaces of the bit line structure 420 and the second capping pattern 505 are exposed. Thus, the lower contact plug layer may be divided into a plurality of lower contact plugs 510 spaced apart from each other by the second capping patterns 505 between the bit line structures 420.

The lower contact plug 510 may include, e.g., doped polysilicon, and may contact the conductive pad structure 230 to be electrically connected to the active pattern 105.

Figure 20:
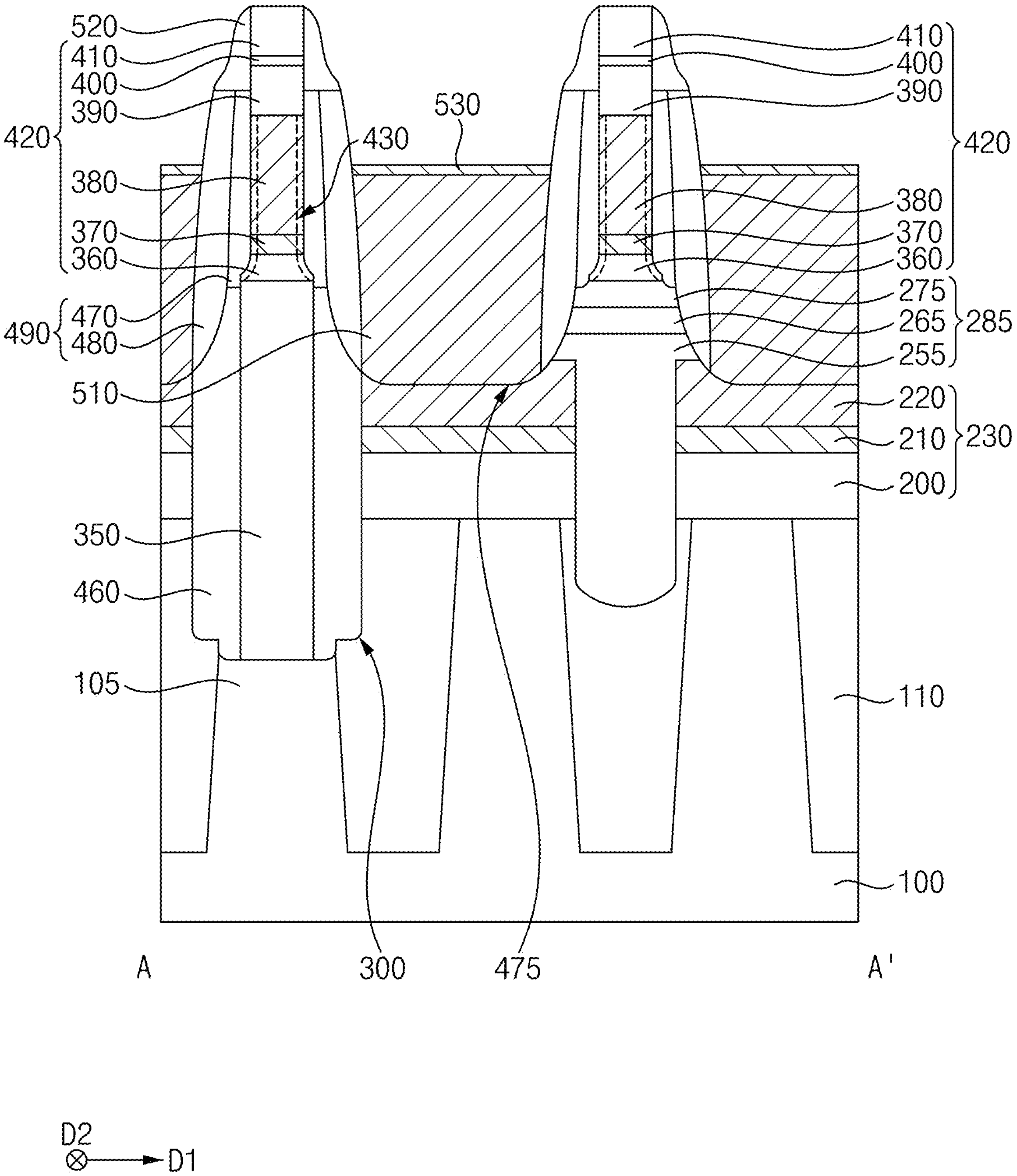

Referring to FIG. 20, an upper portion of the lower contact plug 510 may be removed to expose an upper portion of the spacer structure 490 on the sidewall of the bit line structure 420, and upper portions of the first and second spacers 470 and 480 of the spacer structure 490 may be removed.

The upper portion of the lower contact plug 510 may be removed by, e.g., an etch back process, and the upper portions of the first and second spacers 470 and 480 may be removed by, e.g., a wet etching process.

A third spacer layer may be formed ono the bit line structure 420, the spacer structure 490, the lower contact plug 510 and the second capping pattern 505, and may be anisotropically etched to form a third spacer 520 on an upper sidewall of the bit line structure 420. The third spacer 520 may cover an upper surface of at least a portion of the spacer structure 490.

The lower contact plug 510 may be further removed, and thus an upper surface of the lower contact plug 510 may be lower than an uppermost surface of the spacer structure 490.

A metal silicide pattern 530 may be formed on the upper surface of the lower contact plug 510. In example embodiments, the metal silicide pattern 530 may be formed by forming a first metal layer on the bit line structure 420, the third spacer 520, the spacer structure 490, the lower contact plug 510 and the second capping pattern 505, and performing a heat treatment on the first metal layer, that is, by performing a silicidation process in which the first metal layer including a metal and the lower contact plug 510 including silicon are reacted with each other, and removing an unreacted portion of the first metal layer.

Figure 21:
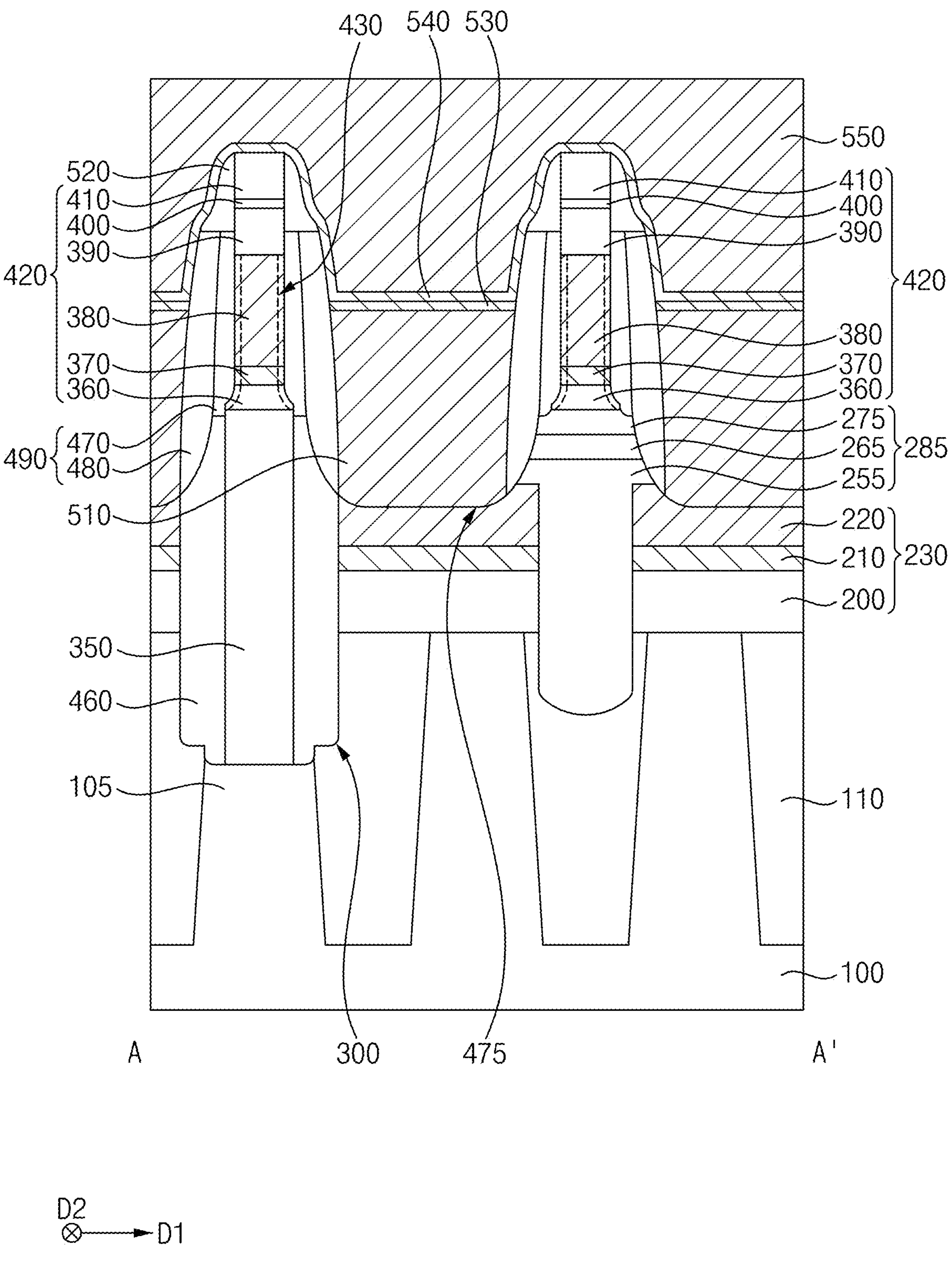

Referring to FIG. 21, a third barrier layer 540 may be formed on the bit line structure 420, the third spacer 520, the spacer structure 490, the metal silicide pattern 530 and the second capping pattern 505, and a second metal layer 550 may be formed on the third barrier layer 540 to fill a space between the bit line structures 420.

A planarization process may be performed on an upper portion of the second metal layer 550. The planarization process may include a CMP process and/or an etch back process.

Referring to FIGS. 22 and 23, the second metal layer 550 and the third barrier layer 540 may be patterned to form an upper contact plug 565, and a seventh opening 570 may be formed between a plurality of upper contact plugs 565.

During the formation of the seventh opening 570, not only the second metal layer 550 and the third barrier layer 540 but also an upper portion of the insulation structure included in the bit line structure 420, the third spacer 520 on the sidewall thereof, and the second capping pattern 505 may also be partially removed.

As the seventh opening 570 is formed, the second metal layer 550 and the third barrier layer 540 may be transformed, respectively, into a second metal pattern 555 and a third barrier pattern 545 covering a lower surface and a sidewall of the second metal pattern 555, which may form a upper contact plug 565. In example embodiments, the plurality of upper contact plugs 565 may be spaced apart from each other in the first and second directions D1 and D2, and may be arranged in a honeycomb pattern or a lattice pattern in a plan view. Each of the upper contact plugs 565 may have a shape of a circle, an ellipse, or a polygon in a plan view.

The lower contact plug 510, the metal silicide pattern 530 and the upper contact plug 565 sequentially stacked on the substrate 100 may collectively form a contact plug structure.

Referring to FIGS. 1 and 2 again, an insulation pattern 580 may be formed to fill the seventh opening 570, a third etch stop layer 590 may be formed on the insulation pattern 580, and a mold layer may be formed on the third etch stop layer 590.

A portion of the mold layer and a portion of the third etch stop layer 590 thereunder may be partially etched to form an eighth opening exposing an upper surface of the upper contact plug 565.

As the plurality of upper contact plugs 565 is spaced apart from each other in the first and second directions D1 and D2, and may be arranged in a honeycomb pattern or a lattice pattern in a plan view, the eighth openings exposing the upper contact plugs 565 may also be arranged in a honeycomb pattern or a lattice pattern in a plan view.

A lower electrode 600 having a shape of a pillar may be formed in the eighth opening, the mold layer may be removed, and a dielectric layer 610 and an upper electrode 620 may be sequentially formed on the lower electrode 600 and the third etch stop layer 590. The lower electrode 600, the dielectric layer 610 and the upper electrode 620 may collectively form a capacitor 630.

In some embodiments, the lower electrode 600 may have a cylindrical shape.

Upper wirings may be further formed on the capacitor 630, so that the fabrication of the semiconductor device may be completed.

As illustrated above, nitrogen may be provided onto the sidewall of the bit line structure 420 to form the nitrogen-containing conductive portion 430 at the lateral portion of the conductive structure of the bit line structure 420. The sacrificial etch stop pattern 440 may be formed on the sidewall of the bit line structure 420 to protect the bit line structure 420 during the etching process or the cleansing process for removing the second sacrificial spacer 320, and may be removed by an ashing process using oxygen after the etching process or the cleansing process.

If the nitrogen-containing conductive portion 430 is not formed, the sidewall of the conductive structure of the bit line structure 420 may be oxidized during the ashing process. However, in example embodiments, the sidewall of the conductive structure of the bit line structure 420 may not be oxidized during the ashing process because of the nitrogen-containing conductive portion 430.

If, for example, a nitride spacer is added onto the sidewall of the bit line structure 420 by a deposition process in order to limit and/or prevent the oxidation of the sidewall of the conductive structure of the bit line structure 420, a triple-layered spacer structure including the first and second spacers 470 and 480 and the nitride spacer may be formed on the sidewall of the bit line structure 420, and thus a space for forming the contact plug structure may not be sufficient. Additionally, the parasitic capacitance between the bit line structures 420 may increase due to the nitride spacer having a relatively high dielectric constant on the sidewall of the bit line structure 420.

However, in example embodiments, instead of forming the nitride spacer on the sidewall of the bit line structure 420, nitrogen may be provided to convert the lateral portion of the bit line structure 420 into the nitrogen-containing conductive portion, and the spacer structure 490 having the double-layered structure may be formed on the sidewall of the bit line structure 420. Thus, the space for forming the contact plug structure may increase.

Additionally, the spacer structure 490 having only the first spacer 470 including an oxide and the second spacer 480 including a nitride may be formed on the sidewall of the bit line structure 420, and thus, when compared to a case in which a spacer structure further including the nitride spacer in addition to the first and second spacers 470 and 480 is formed on the sidewall of the bit line structure 420, the parasitic capacitance between the bit line structures 420 may be low.

While example embodiments have been particularly shown and described, it will be understood by one of ordinary skill in the art that variations in form and detail may be made therein without departing from the spirit and scope of the claims.

What is claimed is:

1. A semiconductor device comprising:

a bit line structure on a substrate, the bit line structure including a conductive structure and an insulation structure stacked in a vertical direction substantially perpendicular to an upper surface of the substrate; and a first spacer and a second spacer stacked in a horizontal direction on a sidewall of the bit line structure, wherein the horizontal direction is substantially parallel to the upper surface of the substrate, the conductive structure includes a nitrogen-containing conductive portion at a lateral portion thereof, an upper surface of the nitrogen-containing conductive portion is coplanar with an upper surface of the conductive structure, and the first spacer contacts the nitrogen-containing conductive portion.

2. The semiconductor device according to claim 1, wherein the conductive structure includes a first conductive pattern, a barrier pattern, and a second conductive pattern sequentially stacked in the vertical direction, and the first conductive pattern, the barrier pattern and the second conductive pattern include doped polysilicon, a metal silicon nitride and a metal, respectively.

3. The semiconductor device according to claim 2, wherein the nitrogen-containing conductive portion includes a first nitrogen-containing portion, a second nitrogen-containing portion, and a third nitrogen-containing portion sequentially stacked in the vertical direction, the first nitrogen-containing portion includes doped polysilicon containing nitrogen, the second nitrogen-containing portion includes the metal silicon nitride, and the third nitrogen-containing portion includes a metal containing nitrogen.

4. The semiconductor device according to claim 3, wherein a concentration of nitrogen of the second nitrogen-containing portion is greater than or equal to a concentration of nitrogen of other portions in the barrier pattern.

5. The semiconductor device according to claim 1, wherein the first spacer includes an oxide, and the second spacer includes a nitride.

6. The semiconductor device according to claim 1, further comprising:

an isolation pattern on the substrate, the isolation pattern exposing an active pattern of the substrate and covering a sidewall of the active pattern; and a conductive filling pattern between the active pattern and the bit line structure, the conductive filling pattern including a conductive material.

7. The semiconductor device according to claim 6, wherein the conductive filling pattern contacts an upper surface of a central portion of the active pattern.

8. The semiconductor device according to claim 6, further comprising:

an insulating filling pattern covering a sidewall of the conductive filling pattern.

9. The semiconductor device according to claim 6, further comprising:

a conductive pad structure on the active pattern and the isolation pattern, wherein the conductive pad structure overlaps at least a portion of the conductive filling pattern in the horizontal direction.

10. The semiconductor device according to claim 1, further comprising:

a third spacer contacting the sidewall of the bit line structure, an upper surface of the first spacer, and an upper surface of the second spacer, wherein the third spacer includes a nitride.

11. A semiconductor device comprising:

a bit line structure on a substrate, the bit line structure having a first conductive pattern including a metal;

a first spacer contacting a sidewall of the bit line structure, the first spacer including an oxide; and a second spacer contacting an outer sidewall of the first spacer, the second spacer including a nitride, wherein the first conductive pattern includes a first nitrogen-containing conductive portion at a lateral portion contacting the first spacer such that a nitrogen concentration of the first nitrogen-containing conductive portion is greater than a nitrogen concentration of an inner portion of the first conductive pattern in a horizontal direction, and the first nitrogen-containing conductive portion includes nitrogen.

12. The semiconductor device according to claim 11, wherein the bit line structure further includes a second conductive pattern under the first conductive pattern, the second conductive pattern includes doped polysilicon, the second conductive pattern includes a second nitrogen-containing portion at a lateral portion contacting the first spacer, and the second nitrogen-containing portion includes doped polysilicon containing nitrogen.

13. The semiconductor device according to claim 12, wherein the bit line structure further includes a third conductive pattern between the first conductive pattern and the second conductive pattern, the third conductive pattern includes a metal silicon nitride, the third conductive pattern includes a third nitrogen-containing portion at a lateral portion contacting the first spacer, the third nitrogen-containing portion including the metal silicon nitride, and a concentration of nitrogen in the third nitrogen-containing portion is greater than or equal to a concentration of nitrogen of other portions in the third conductive pattern.

14. A semiconductor device comprising:

an active pattern on a substrate;

an isolation pattern on the substrate, the isolation pattern covering a sidewall of the active pattern;

a gate structure extending in a first direction, the first direction being substantially parallel to an upper surface of the substrate, and the gate structure being buried in an upper portion of the active pattern and an upper portion of the isolation pattern;

a bit line structure on a central portion of the active pattern and the isolation pattern, the bit line structure extending in a second direction, the second direction being substantially parallel to the upper surface of the substrate and substantially perpendicular to the first direction, and the bit line structure including a conductive structure and an insulation structure stacked in a vertical direction, the vertical direction being substantially perpendicular to the upper surface of the substrate;

a first spacer and a second spacer stacked in the first direction on a sidewall of the bit line structure;

a contact plug structure on each of opposite end portions of the active pattern; and a capacitor on the contact plug structure, wherein the conductive structure has a nitrogen-containing conductive portion at a lateral portion thereof, the nitrogen-containing conductive portion includes nitrogen, the first spacer contacts the nitrogen-containing conductive portion, the conductive structure includes a first conductive pattern, a barrier pattern, and a second conductive pattern sequentially stacked in the vertical direction, the first conductive pattern, the barrier pattern and the second conductive pattern include different conductive materials from each other, and the nitrogen-containing conductive portion of the conductive structure includes a first nitrogen-containing portion, a second nitrogen-containing portion and a third nitrogen-containing portion in respective lateral portions of the first conductive pattern, the barrier pattern and the second conductive pattern.

15. The semiconductor device according to claim 14, further comprising:

a conductive filling pattern between the central portion of the active pattern and the bit line structure.

16. The semiconductor device according to claim 15, further comprising:

an insulating filling pattern covering a sidewall of the conductive filling pattern.

17. The semiconductor device according to claim 16, further comprising:

a conductive pad structure on the active pattern and the isolation pattern, wherein the conductive pad structure contacts the insulating filling pattern.

18. The semiconductor device according to claim 17, wherein the contact plug structure contacts an upper surface of the conductive pad structure.

19. The semiconductor device according to claim 14, wherein an inner portion of the conductive structure include a first conductive pattern, a barrier pattern, and a second conductive pattern sequentially stacked in the vertical direction, the first conductive pattern, the barrier pattern and the second conductive pattern include doped polysilicon, a metal silicon nitride and a metal, respectively, the nitrogen-containing conductive portion includes a first nitrogen-containing portion, a second nitrogen-containing portion, and a third nitrogen-containing portion sequentially stacked in the vertical direction, the first nitrogen-containing portion includes doped polysilicon containing nitrogen, the second nitrogen-containing portion includes a metal silicon nitride, and the third nitrogen-containing portion includes a metal containing nitrogen.

20. The semiconductor device according to claim 14, wherein the first spacer includes an oxide, and the second spacer includes a nitride.

* * * * *